(12) United States Patent
Kim et al.

(10) Patent No.: US 6,825,447 B2
(45) Date of Patent: Nov. 30, 2004

(54) APPARATUS AND METHOD FOR UNIFORM SUBSTRATE HEATING AND CONTAMINATE COLLECTION

(75) Inventors: Sam H. Kim, Fremont, CA (US); Akihiro Hosokawa, Cupertino, CA (US); Dong Choon Suh, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/321,289

(22) Filed: Dec. 17, 2002

(65) Prior Publication Data

US 2003/0132213 A1 Jul. 17, 2003

Related U.S. Application Data

(63) Continuation-in-part of application No. 10/025,152, filed on Dec. 18, 2001, now Pat. No. 6,765,178.
(60) Provisional application No. 60/259,035, filed on Dec. 29, 2000.

(51) Int. Cl.[7] .................................................. F27B 5/14
(52) U.S. Cl. ...................... 219/390; 219/411; 219/405; 118/724; 118/725; 118/50.1; 392/416; 392/418
(58) Field of Search ................................. 219/390, 405, 219/411; 115/724, 725, 50.1; 392/416, 418

(56) References Cited

U.S. PATENT DOCUMENTS

| | | | |
|---|---|---|---|
| 3,862,397 A | 1/1975 | Anderson et al. | 219/405 |
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |

(List continued on next page.)

FOREIGN PATENT DOCUMENTS

| | | | |
|---|---|---|---|
| DE | 196 27 017 | 1/1997 | H01L/21/283 |
| DE | 198 20 147 | 7/1999 | H01L/21/3205 |
| EP | 0 344 352 A1 | 12/1989 | H01L/39/24 |
| EP | 0 429 270 A2 | 5/1991 | G03F/7/36 |
| EP | 0 442 490 A1 | 8/1991 | C30B/25/02 |

(List continued on next page.)

OTHER PUBLICATIONS

Hultman, et al., "Review of the thermal and mechanical stability of TiN–based thin films", *Zeitschrift Fur Metallkunde*, 90(10) (Oct. 1999), pp. 803–813.

Klaus, et al., "Atomic Layer Deposition of $SiO_2$ Using Catalyzed and Uncatalyzed Self–Limiting Surface Reactions", *Surface Review & Letters*, 6(3&4) (1999), pp. 435–448.

(List continued on next page.)

*Primary Examiner*—Shawntina Fuqua
(74) *Attorney, Agent, or Firm*—Moser, Patterson & Sheridan LLP

(57) ABSTRACT

Embodiments of the invention generally provides an apparatus and method for heating substrates, comprising a heater disposed within a chamber, a plurality of heated supports movably disposed within the chamber to support at least two substrates thereon and a contamination collector disposed in communication with the chamber.

24 Claims, 14 Drawing Sheets

U.S. PATENT DOCUMENTS

| | | | |
|---|---|---|---|
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Matsumoto | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,993,357 A | 2/1991 | Scholz | 118/715 |
| 5,000,113 A | 3/1991 | Wang et al. | 118/723 |
| 5,013,683 A | 5/1991 | Petroff et al. | 437/110 |
| 5,028,565 A | 7/1991 | Chang et al. | 437/192 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |
| 5,166,092 A | 11/1992 | Mochizuki et al. | 437/105 |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | 437/108 |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |
| 5,254,207 A | 10/1993 | Nishizawa et al. | 156/601 |
| 5,256,244 A | 10/1993 | Ackerman | 156/613 |
| 5,259,881 A | 11/1993 | Edwards et al. | 118/719 |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | 118/697 |
| 5,286,296 A | 2/1994 | Sato et al. | 118/719 |
| 5,290,748 A | 3/1994 | Knuuttila et al. | 502/228 |
| 5,294,286 A | 3/1994 | Nishizawa et al. | 156/610 |
| 5,296,403 A | 3/1994 | Nishizawa et al. | 437/133 |
| 5,300,186 A | 4/1994 | Kitahara et al. | 156/613 |
| 5,311,055 A | 5/1994 | Goodman et al. | 257/593 |
| 5,316,615 A | 5/1994 | Copel | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,389 A | 8/1994 | Nishizawa et al. | 117/89 |
| 5,348,911 A | 9/1994 | Jurgensen et al. | 117/91 |
| 5,374,570 A | 12/1994 | Nasu et al. | 437/40 |
| 5,395,791 A | 3/1995 | Cheng et al. | 437/105 |
| 5,438,952 A | 8/1995 | Otsuka | 117/84 |
| 5,439,876 A | 8/1995 | Graf et al. | 505/447 |
| 5,441,703 A | 8/1995 | Jurgensen | 422/129 |
| 5,443,033 A | 8/1995 | Nishizawa et al. | 117/86 |
| 5,443,647 A | 8/1995 | Aucoin et al. | 118/723 ME |
| 5,455,072 A | 10/1995 | Bension et al. | 427/255.7 |
| 5,458,084 A | 10/1995 | Thorne et al. | 117/89 |
| 5,469,806 A | 11/1995 | Mochizuki et al. | 117/97 |
| 5,480,818 A | 1/1996 | Matsumoto et al. | 437/40 |
| 5,483,919 A | 1/1996 | Yokoyama et al. | 117/89 |
| 5,484,664 A | 1/1996 | Kitahara et al. | 428/64.1 |
| 5,503,875 A | 4/1996 | Imai et al. | 427/255.3 |
| 5,521,126 A | 5/1996 | Okamura et al. | 437/235 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,561,735 A | 10/1996 | Camm | 392/416 |
| 5,567,152 A | 10/1996 | Morimoto | 432/241 |
| 5,580,380 A | 12/1996 | Liu et al. | 117/86 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | 118/711 |
| 5,730,801 A | 3/1998 | Tepman et al. | 118/719 |
| 5,730,802 A | 3/1998 | Ishizumi et al. | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,850,071 A * | 12/1998 | Makiguchi et al. | 219/390 |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | 118/719 |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,879,459 A | 3/1999 | Gadgil et al. | 118/715 |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,916,365 A | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,015,590 A | 1/2000 | Suntola et al. | 427/255.23 |
| 6,025,627 A | 2/2000 | Forbes et al. | 257/321 |
| 6,036,773 A | 3/2000 | Wang et al. | 117/97 |
| 6,042,652 A | 3/2000 | Hyun et al. | 118/719 |
| 6,043,177 A | 3/2000 | Falconer et al. | 502/4 |
| 6,046,439 A | 4/2000 | Johnsgard et al. | 219/444.1 |
| 6,051,286 A | 4/2000 | Zhao et al. | 427/576 |
| 6,062,798 A | 5/2000 | Muka | 414/416 |
| 6,071,808 A | 6/2000 | Merchant et al. | 438/633 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,124,158 A | 9/2000 | Dautartas et al. | 438/216 |
| 6,130,147 A | 10/2000 | Major et al. | 438/604 |
| 6,139,700 A | 10/2000 | Kang et al. | 204/192.17 |
| 6,140,237 A | 10/2000 | Chan et al. | 438/687 |
| 6,140,238 A | 10/2000 | Kitch | 438/687 |
| 6,143,659 A | 11/2000 | Leem | 438/688 |
| 6,144,060 A | 11/2000 | Park et al. | 257/310 |
| 6,147,334 A | 11/2000 | Hannigan | 219/544 |
| 6,151,447 A | 11/2000 | Moore et al. | 392/418 |
| 6,158,446 A | 12/2000 | Mohindra et al. | 134/25.4 |

| | | | | |
|---|---|---|---|---|
| 6,174,377 B1 | 1/2001 | Doering et al. ............. 118/729 | JP 63-266814 | 11/1988 | ......... H01L/21/205 |
| 6,174,809 B1 | 1/2001 | Kang et al. ................. 438/682 | JP 64-009895 | 1/1989 | ........... C30B/29/40 |
| 6,183,563 B1 | 2/2001 | Choi et al. .................. 118/715 | JP 64-009896 | 1/1989 | ........... C30B/29/40 |
| 6,200,893 B1 | 3/2001 | Sneh .......................... 438/685 | JP 64-009897 | 1/1989 | ........... C30B/29/40 |
| 6,203,613 B1 | 3/2001 | Gates et al. ................ 117/104 | JP 64-037832 | 2/1989 | ........ H01L/21/205 |
| 6,206,967 B1 | 3/2001 | Mak et al. ................... 118/666 | JP 64-082615 | 3/1989 | ........ H01L/21/205 |
| 6,207,302 B1 | 3/2001 | Sugiura et al. ............. 428/690 | JP 64-082617 | 3/1989 | ........ H01L/21/205 |
| 6,231,672 B1 | 5/2001 | Choi et al. .................. 118/715 | JP 64-082671 | 3/1989 | ........... H01L/29/78 |
| 6,248,605 B1 | 6/2001 | Harkonen et al. ........... 438/29 | JP 64-082676 | 3/1989 | ........... H01L/29/80 |
| 6,270,572 B1 | 8/2001 | Kim et al. .................... 117/93 | JP 01-103982 | 4/1989 | ........... C30B/23/08 |
| 6,271,148 B1 | 8/2001 | Kao et al. ................... 438/727 | JP 01-103996 | 4/1989 | ........... C30B/29/40 |
| 6,287,965 B1 | 9/2001 | Kang et al. ................. 438/648 | JP 64-090524 | 4/1989 | ........ H01L/21/205 |
| 6,291,876 B1 | 9/2001 | Stumborg et al. ........... 257/632 | JP 01-117017 | 5/1989 | ........ H01H/21/203 |
| 6,305,314 B1 | 10/2001 | Sneh et al. ............. 118/723 R | JP 01-143221 | 6/1989 | ........ H01L/21/314 |
| 6,306,216 B1 | 10/2001 | Kim et al. .................. 118/725 | JP 01-143233 | 6/1989 | ........ H01L/21/76 |
| 6,316,098 B1 | 11/2001 | Yitzchaik et al. ........... 428/339 | JP 01-154511 | 6/1989 | ........ H01L/21/20 |
| 6,447,607 B2 | 9/2002 | Soininen et al. ............ 117/200 | JP 01-236657 | 9/1989 | ........ H01L/29/80 |
| 6,478,872 B1 | 11/2002 | Chae et al. ................... 117/88 | JP 01-245512 | 9/1989 | ........ H01L/21/205 |
| 6,481,945 B1 | 11/2002 | Hasper et al. .............. 414/217 | JP 01-264218 | 10/1989 | ........ H01L/21/205 |
| 6,511,539 B1 | 1/2003 | Raaijmakers ............... 117/102 | JP 01-270593 | 10/1989 | ........ C30B/25/02 |
| 6,534,748 B1 * | 3/2003 | Zinman et al. .............. 219/390 | JP 01-272108 | 10/1989 | ........ H01L/21/203 |
| 6,551,406 B2 | 4/2003 | Kilpi .......................... 118/728 | JP 01-290221 | 11/1989 | ........ H01L/21/205 |
| 2001/0000866 A1 | 5/2001 | Sneh et al. ............ 118/723 IR | JP 01-290222 | 11/1989 | ........ H01L/21/205 |
| 2001/0009140 A1 | 7/2001 | Bondestam et al. ........ 118/725 | JP 01-296673 | 11/1989 | ........... H01L/29/88 |
| 2001/0011526 A1 | 8/2001 | Doering et al. ............. 118/729 | JP 01-303770 | 12/1989 | ........ H01L/39/24 |
| 2001/0013312 A1 | 8/2001 | Soininen et al. .............. 117/86 | JP 01-305894 | 12/1989 | ........... C30B/23/08 |
| 2001/0014371 A1 | 8/2001 | Kilpi ...................... 427/255.28 | JP 01-313927 | 12/1989 | ........ H01L/21/205 |
| 2001/0031562 A1 | 10/2001 | Raaijmakers et al. ....... 438/770 | JP 02-012814 | 1/1990 | ........ H01L/21/205 |
| 2001/0034123 A1 | 10/2001 | Jeon et al. .................. 438/643 | JP 02-014513 | 1/1990 | ........ H01L/21/205 |
| 2001/0041250 A1 | 11/2001 | Werkhoven et al. ........ 428/212 | JP 02-017634 | 1/1990 | ........ H01L/21/225 |
| 2001/0042523 A1 | 11/2001 | Kesala ........................ 122/6.6 | JP 02-063115 | 3/1990 | ........ H01L/21/20 |
| 2001/0042799 A1 | 11/2001 | Kim et al. ................... 239/553 | JP 02-074029 | 3/1990 | ........ H01L/21/205 |
| 2001/0054377 A1 | 12/2001 | Lindfors et al. ............. 117/104 | JP 02-074587 | 3/1990 | ........... C30B/23/08 |
| 2002/0000196 A1 | 1/2002 | Park ........................... 118/715 | JP 02-106822 | 4/1990 | ........... H01B/13/00 |
| 2002/0007790 A1 | 1/2002 | Park ........................... 118/715 | JP 02-129913 | 5/1990 | ........ H01L/21/205 |
| 2002/0041931 A1 | 4/2002 | Suntola et al. .......... 427/255.28 | JP 02-162717 | 6/1990 | ........ H01L/21/20 |
| 2002/0052097 A1 | 5/2002 | Park ........................... 438/507 | JP 02-172895 | 7/1990 | ........... C30B/29/36 |
| 2002/0086106 A1 | 7/2002 | Park et al. ................ 427/248.1 | JP 02-196092 | 8/1990 | ........... C30B/25/14 |
| 2002/0092471 A1 | 7/2002 | Kang et al. ................. 118/715 | JP 02-203517 | 8/1990 | ........ H01L/21/205 |
| 2002/0094689 A1 | 7/2002 | Park ........................... 438/694 | JP 02-230690 | 9/1990 | ........... H05B/33/10 |
| 2002/0108570 A1 | 8/2002 | Lindfors ..................... 118/715 | JP 02-230722 | 9/1990 | ........ H01L/21/205 |
| 2002/0134307 A1 | 9/2002 | Choi ........................... 118/715 | JP 02-246161 | 10/1990 | ........ H01L/29/784 |
| 2003/0004723 A1 | 1/2003 | Chihara ...................... 704/260 | JP 02-264491 | 10/1990 | ............. H01S/3/18 |
| 2003/0075273 A1 | 4/2003 | Kilpela et al. .......... 156/345.33 | JP 02-283084 | 11/1990 | ............. H01S/3/18 |
| 2003/0075925 A1 | 4/2003 | Lindfors et al. ............. 285/367 | JP 02-304916 | 12/1990 | ........ H01L/21/205 |
| | | | JP 03-019211 | 1/1991 | ........ H01L/21/205 |
| FOREIGN PATENT DOCUMENTS | | | JP 03-022569 | 1/1991 | ........ H01L/29/804 |
| EP | 0 799 641 A2 | 10/1997 ........... B01J/20/32 | JP 03-023294 | 1/1991 | ........... C30B/25/18 |
| EP | 1167569 | 1/2002 ........ C23C/16/455 | JP 03-023299 | 1/1991 | ........... C30B/29/40 |
| FR | 2 626 110 | 7/1989 ........... H01L/39/34 | JP 03/044967 | 2/1991 | ........ H01L/29/48 |
| FR | 2 692 597 | 12/1993 ........... C23C/16/00 | JP 03/048421 | 3/1991 | ........ H01L/21/302 |
| GB | 2 298 314 A | 8/1996 ........... H01L/21/00 | JP 03-070124 | 3/1991 | ........ H01L/21/205 |
| GB | 2 355 727 A | 5/2001 ........... C23C/16/44 | JP 03-185716 | 8/1991 | ........ H01L/21/205 |
| JP | 58-098917 | 6/1983 ........ H01L/21/205 | JP 03-208885 | 9/1991 | ........... C30B/23/02 |
| JP | 58-100419 | 6/1983 ........... H01L/21/20 | JP 03-234025 | 10/1991 | ........ H01L/21/318 |
| JP | 60-065712 A | 4/1985 ........... C01B/33/113 | JP 03-286522 | 12/1991 | ........ H01L/21/205 |
| JP | 61-035847 | 2/1986 ........... B01J/19/08 | JP 03-286531 | 12/1991 | ........ H01L/21/316 |
| JP | 61-210623 | 9/1986 ........ H01L/21/205 | JP 04-031391 | 2/1992 | ........... C30B/23/08 |
| JP | 62-069508 | 3/1987 ........ H01L/21/203 | JP 04-031396 | 2/1992 | ........... C30B/25/14 |
| JP | 62-091495 A | 4/1987 ........... C30B/25/02 | JP 04-100292 | 4/1992 | ............. H01S/3/18 |
| JP | 62-141717 | 6/1987 ........ H01L/21/203 | JP 04-111418 | 4/1992 | ........ H01L/21/205 |
| JP | 62-167297 | 7/1987 ........... C30B/29/40 | JP 04-132214 | 5/1992 | ........ H01L/21/205 |
| JP | 62-171999 | 7/1987 ........... C30B/29/40 | JP 04-132681 | 5/1992 | ........... C30B/25/14 |
| JP | 62-232919 | 10/1987 ........ H01L/21/205 | JP 04/151822 | 5/1992 | ........ H01L/21/205 |
| JP | 63-062313 | 3/1988 ........ H01L/21/203 | JP 04-162418 | 6/1992 | ........ H01L/21/205 |
| JP | 63-085098 | 4/1988 ........... C30B/21/40 | JP 04-175299 | 6/1992 | ........... C30B/29/68 |
| JP | 63-090833 | 4/1988 ........ H01L/21/365 | JP 04-186824 | 7/1992 | ........ H01L/21/205 |
| JP | 63-222420 | 9/1988 ........ H01L/21/205 | JP 04-212411 | 8/1992 | ........ H01L/21/203 |
| JP | 63-222421 | 9/1988 ........ H01L/21/205 | JP 04-260696 | 9/1992 | ........... C30B/29/40 |
| JP | 63-227007 | 9/1988 ........ H01L/21/205 | JP 04-273120 | 9/1992 | ........... H01L/21/20 |
| JP | 63-252420 | 10/1988 ........ H01L/21/205 | JP 04-285167 | 10/1992 | ........... C23C/14/54 |

| | | | | |
|---|---|---|---|---|
| JP | 04-325500 | 11/1992 | ........... C30B/33/00 |
| JP | 04-328874 | 11/1992 | ......... H01L/29/804 |
| JP | 05-029228 | 2/1993 | ......... H01L/21/205 |
| JP | 05-047665 | 2/1993 | ......... H01L/21/205 |
| JP | 05-047666 | 2/1993 | ......... H01L/21/205 |
| JP | 05-047668 | 2/1993 | ......... H01L/21/205 |
| JP | 05-074717 | 3/1993 | ......... H01L/21/205 |
| JP | 05-074724 | 3/1993 | ......... H01L/21/205 |
| JP | 05-102189 | 4/1993 | ......... H01L/21/336 |
| JP | 05-160152 | 6/1993 | ......... H01L/21/336 |
| JP | 05-175143 | 7/1993 | ......... H01L/21/205 |
| JP | 05-175145 | 7/1993 | ......... H01L/21/205 |
| JP | 05-182906 | 7/1993 | ........... H01L/21/20 |
| JP | 05-186295 | 7/1993 | ........... C30B/25/02 |
| JP | 05-206036 | 8/1993 | ......... H01L/21/205 |
| JP | 05-234899 | 9/1993 | ......... H01L/21/205 |
| JP | 05-235047 | 9/1993 | ......... H01L/21/338 |
| JP | 05-251339 | 9/1993 | ........... H01L/21/20 |
| JP | 04-291916 | 10/1993 | ......... H01L/21/205 |
| JP | 05-270997 | 10/1993 | ........... C30B/29/68 |
| JP | 05-283336 | 10/1993 | ........... H01L/21/20 |
| JP | 05-291152 | 11/1993 | ......... H01L/21/205 |
| JP | 05-304334 | 11/1993 | ............. H01L/3/18 |
| JP | 05-343327 | 12/1993 | ......... H01L/21/205 |
| JP | 05-343685 | 12/1993 | ......... H01L/29/784 |
| JP | 06-045606 | 2/1994 | ......... H01L/29/784 |
| JP | 06-132236 | 5/1994 | ......... H01L/21/205 |
| JP | 06-177381 | 6/1994 | ......... H01L/29/784 |
| JP | 06-196809 | 7/1994 | ............. H01S/3/18 |
| JP | 06-222388 | 8/1994 | ........... G02F/1/136 |
| JP | 06-224138 | 8/1994 | ......... H01L/21/205 |
| JP | 06-230421 | 8/1994 | ........... G02F/1/136 |
| JP | 06-252057 | 9/1994 | ......... H01L/21/205 |
| JP | 06-291048 | 10/1994 | ......... H01L/21/205 |
| JP | 07-070752 | 3/1995 | ........... C23C/16/40 |
| JP | 07-086269 | 3/1995 | ......... H01L/21/314 |
| JP | 08-181076 | 7/1996 | ......... H01L/21/205 |
| JP | 08-245291 | 9/1996 | ........... C30B/25/14 |
| JP | 08-264530 | 10/1996 | ....... H01L/21/3205 |
| JP | 09-260786 | 10/1997 | ............. H01S/3/18 |
| JP | 09-293681 | 11/1997 | ......... H01L/21/205 |
| JP | 10-188840 | 7/1998 | ........... H01J/29/18 |
| JP | 10-190128 | 7/1998 | ............. H01S/3/18 |
| JP | 10-308283 | 11/1998 | ........... H05B/33/22 |
| JP | 11-269652 | 10/1999 | ........... C23C/16/44 |
| JP | 2000-031387 | 1/2000 | ........... H01L/27/04 |
| JP | 2000-058777 | 2/2000 | ......... H01L/27/108 |
| JP | 2000-068072 | 3/2000 | ........... H05B/33/22 |
| JP | 2000-087029 | 3/2000 | ........... C09K/11/08 |
| JP | 2000-138094 | 5/2000 | ........... H05B/33/10 |
| JP | 2000-218445 | 8/2000 | ............. B23P/6/00 |
| JP | 2000-319772 | 11/2000 | ........... C23C/14/24 |
| JP | 2000-340883 | 12/2000 | ......... H01S/5/125 |
| JP | 2000-353666 | 12/2000 | ......... H01L/21/205 |
| JP | 2001-020075 | 1/2001 | ........... C23C/16/44 |
| JP | 2001-62244 | 3/2001 | ........... B01D/53/34 |
| JP | 2001-152339 | 6/2001 | ........... C23C/16/40 |
| JP | 2001-172767 | 6/2001 | ........... C23C/16/40 |
| JP | 2001-189312 | 7/2001 | ......... H01L/21/316 |
| JP | 2001-217206 | 8/2001 | ......... H01L/21/285 |
| JP | 2001-220287 | 8/2001 | ........... C30B/25/02 |
| JP | 2001-220294 | 8/2001 | ........... C30B/29/20 |
| JP | 2001-240972 | 9/2001 | ......... C23C/16/458 |
| JP | 2001-254181 | 9/2001 | ........... C23C/16/46 |
| JP | 2001-284042 | 10/2001 | ........... H05B/33/04 |
| JP | 2001-303251 | 10/2001 | ........... C23C/16/44 |
| JP | 2001-328900 | 11/2001 | ........... C30B/29/68 |
| WO | 90/02216 | 3/1990 | ........... C23C/14/34 |
| WO | 91/10510 A1 | 7/1991 | ........... B01J/37/02 |
| WO | 93/02111 A1 | 2/1993 | ............. C08F/4/78 |
| WO | 96/17107 | 6/1996 | ........... C23C/16/44 |
| WO | 96/18756 A1 | 6/1996 | ........... C23C/16/08 |
| WO | 98/06889 | 2/1998 | |
| WO | 98/51838 | 11/1998 | ........... C23C/16/06 |
| WO | 99/01595 | 1/1999 | ........... C30B/25/14 |
| WO | 99/13504 | 3/1999 | ........... H01L/21/68 |
| WO | 99/29924 A1 | 6/1999 | ........... C23C/16/04 |
| WO | 99/41423 A2 | 6/1999 | |
| WO | 99/65064 | 12/1999 | ........... H01L/21/00 |
| WO | 00/11721 | 3/2000 | ........... H01L/29/43 |
| WO | 00/15865 A1 | 3/2000 | ........... C23C/16/00 |
| WO | 00/15881 A2 | 3/2000 | |
| WO | 00/16377 A2 | 3/2000 | |
| WO | 00/54320 | 9/2000 | ........... H01L/21/44 |
| WO | 00/63957 A1 | 10/2000 | ......... H01L/21/205 |
| WO | 00/79019 A1 | 12/2000 | ........... C23C/16/00 |
| WO | 00/79576 | 12/2000 | ......... H01L/21/205 |
| WO | 01/15220 A1 | 3/2001 | ......... H01L/21/768 |
| WO | 01/17692 | 3/2001 | ........... B05C/11/00 |
| WO | 01/27346 A1 | 4/2001 | ........... C23C/16/44 |
| WO | 01/27347 A1 | 4/2001 | ........... C23C/16/44 |
| WO | 01/29280 A1 | 4/2001 | ........... C23C/16/32 |
| WO | 01/29891 A1 | 4/2001 | ......... H01L/21/768 |
| WO | 01/29893 A1 | 4/2001 | ......... H01L/21/768 |
| WO | 01/36702 | 5/2001 | ........... C23C/16/00 |
| WO | 01/40541 A1 | 6/2001 | ........... C23C/16/40 |
| WO | 01/66832 A2 | 9/2001 | ........... C30B/16/44 |
| WO | 02/08488 | 1/2002 | ........... C23C/16/44 |

OTHER PUBLICATIONS

Yamaguchi, et al., "Atomic–layer chemical–vapor–deposition of silicon dioxide films with extremely low hydrogen content", *Appl. Surf. Sci.*, vol. 130–132 (1998), pp. 202–207.

George, et al., "Surface Chemistry for Atomic Layer Growth", *J. Phys. Chem.*, vol. 100 (1996), pp. 13121–13131.

George, et al., "Atomic layer controlled deposition of $SiO_2$ and $Al_2O_3$ using ABAB . . . binary reaction sequence chemistry", *Appl. Surf. Sci.*, vol. 82/83 (1994), pp. 460–467.

Wise, et al., "Diethyldiethoxysilane as a new precursor for $SiO_2$ growth on silicon", *Mat. Res. Soc. Symp. Proc.*, vol. 334 (1994), pp. 37–43.

Niinisto, et al., "Synthesis of oxide thin films and overlayers by atomic layer epitaxy for advanced applications", *Mat. Sci. & Eng.*, vol. B41 (1996), pp. 23–29.

Ritala, et al., "Perfectly conformal TiN and $Al_2O_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions". *Appl. Surf. Sci.*, vol. 162–163 (2000), pp. 479–491.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13–16, 1998), pp. 337–342.

Klaus, et al., "Atomic Layer Deposition of Tungsten using Sequential Surface Chemistry with a Sacrificial Stripping Reaction, " Thin Solid Films 360 (2000), pp. 145–153, (Accepted Nov. 16, 1999).

Min, et al., "Metal–Organic Atomic–Layer Deposition of Titanium–Silicon–Nitride Films", *Applied Physics Letters*, American Inst. Of Physics, vol. 75(11) (Sep. 13, 1999).

Martensson, et al., "Atomic Layer Epitaxy of Copper on Tantalum", *Chemical Vapor Deposition*, 3(1) (Feb. 1, 1997), pp. 45–50.

Ritala, et al. "Atomic Layer Epitaxy Growth of TiN Thin Films", *J. Electrochem. Soc.,* 142(8) (Aug. 1995), pp. 2731–2737.

Elers, et al., "NbC15 as a precursor in atomic layer epitaxy", *Appl. Surf. Sci.,* vol. 82/83 (1994), pp. 468–474.

Lee, "The Preparation of Titanium–Based Thin Film by CVD Using Titanium Chlorides as Precursors", *Chemical Vapor Deposition,* 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", *J. Electrochem. Soc.,* 145(8) (Aug. 1998), pp. 2926–2931.

Min, et al., "Chemical Vapor Deposition of Ti–Si–N Films with Alternating Source Supply", *Mat. Res. Soc. Symp. Proc.,* vol. 564 (Apr. 5, 1999), pp. 207–210.

Bedair, "Atomic layer epitaxy deposition processes",*J. Vac. Sci. Technol.* 12(1) (Jan./Feb. 1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

Elam, et al., "Nucleation and growth during tungsten atomic layer deposition on SiO2 surfaces," Thin Solid Films 386 (2001) pp. 41–52, (Accepted Dec. 14, 2000).

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu$m contact filing by 450° C–hydrazine–reduced TiN film with low resistivity", IEDM 92–979, pp. 11.8.1–11.8.3.

Suzuki, et al., "LPCVD–TiN Using Hydrazine and TiCl$_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition/ Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of TiB$_2$ as a Diffusion Barrier on Silicon", J. Electrochem. Soc. 138(10). (Oct. 1991), pp. 3062–3067.

"Cluster Tools for Fabrication of Advanced devices" Jap. J. of Applied Physics, Extended Abstracts, 22$^{nd}$ Conference Solid State Devices and Materials (1990), pp. 849–852.

"Applications of Integrated processing", Solid State Technology, US, Cowan Pub., vol. 37, No. 12 (Dec. 1, 1994), pp. 45–47.

Kitigawa, et al., "Hydrogen–mediated low temperature epitaxy of Si in plasma–enhanced chemical vapor deposition", Applied Surface Science (2000), pp. 30–34.

Lee, et al., "Pulsed nucleation for ultra–high aspect ratio tungsten plugfill", Novellus Systems, Inc. (2001), pp. 1–2 (Copy Not Available to Applicant at this Time).

International Preliminary Examination Report for PCT/ US01/50262, dated Oct. 23, 2003.

* cited by examiner

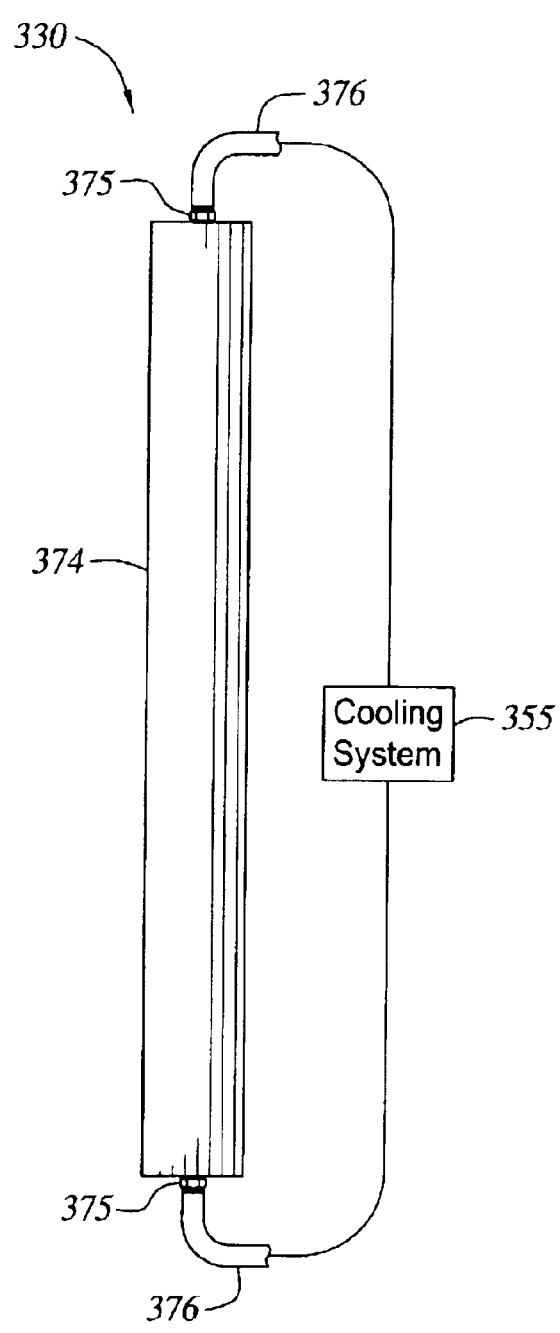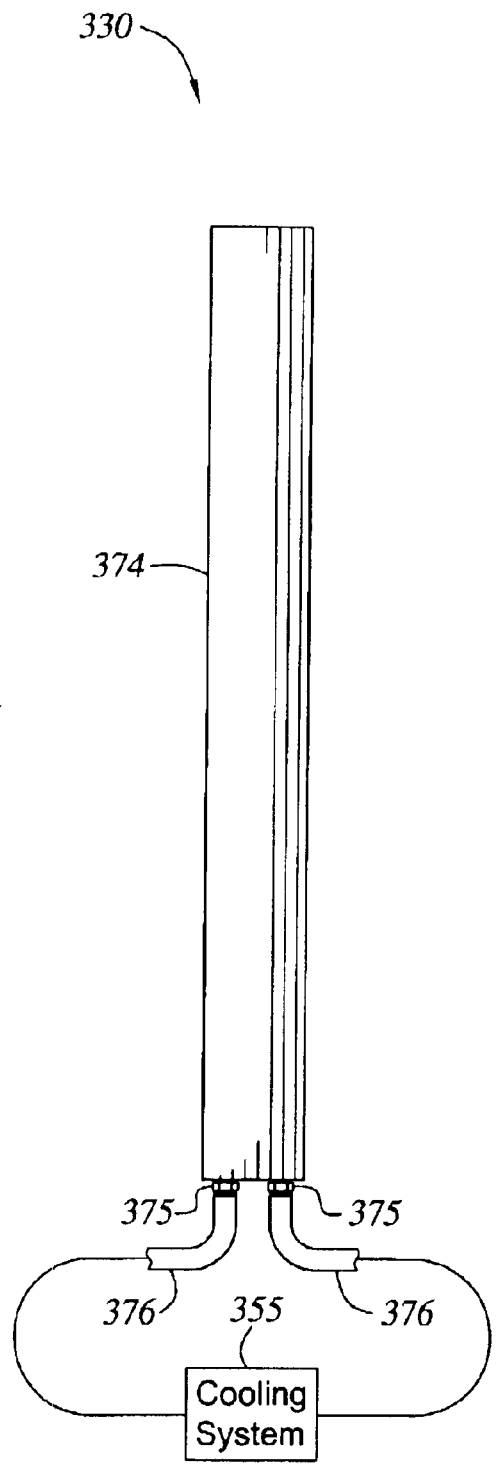
Fig. 13A
Fig. 13B

APPARATUS AND METHOD FOR UNIFORM SUBSTRATE HEATING AND CONTAMINATE COLLECTION

CROSS-REFERENCE TO RELATED APPLICATIONS

This application is a continuation in part of U.S. patent application Ser. No. 10/025,152, filed Dec. 18, 2001, now U.S. Pat. No. 6,765,178, entitled "Chamber for Uniform Substrate Heating", which claims benefit of U.S. Provisional Patent Application Ser. No. 60/259,035, filed Dec. 29, 2000, both of which are herein incorporated by reference.

BACKGROUND OF THE INVENTION

1. Field of the Invention

Aspects of the invention generally relate to an apparatus and method for heat processing substrates and, more particular, to a method and apparatus for minimizing contaminates within a thermal processing chamber.

2. Background of the Related Art

In the fabrication of flat panel displays (FPD), thin film transistors (TFT) and liquid crystal cells, metal interconnects and other features are formed by depositing and removing multiple layers of conducting, semiconducting and dielectric materials from a glass substrate. The various features formed are integrated into a system that collectively is used to create, for example, active matrix display screens in which display states are electrically created in individual pixels on the FPD. Processing techniques used to create the FPD include plasma-enhanced chemical vapor deposition (PECVD), physical vapor deposition (PVD), etching and the like. Plasma processing is particularly well suited for the production of flat panel displays because of the relatively lower processing temperatures required to deposit films and good film quality which results from plasma processes.

During FPD processing, proper heat processing of the film across the entire surface of the substrate is critical for the FPD to function properly. The temperature required varies depending on the type of film being processed, and the process being performed. For example, one exemplary type of flat panel display film used in the construction of FPDs is low temperature polysilicon (LTPS). Part of the LTPS process requires the LTPS film be heated to about 600° C. to remove hydrogen from the film, whereas a similar heat treatment for amorphous silicon (α-Si) film requires a substantially lower temperature of about 450° C.

Generally, the film heating process is temperature sensitive as temperature non-uniformity may cause insufficient removal of contaminates, resulting in peeling and ablation of the film. To compensate for temperature non-uniformity heating process times must be extended. Unfortunately, extending the heating process times increases the production cost and often results in unusable films if the process is not completed.

Conventional thermal chambers provide heat processing by heating one or more substrates through a combination of thermal conduction and radiation. Unfortunately, the chamber walls and other internal chamber components provide thermal conduction paths within the chamber resulting in conductive heat losses. The conductive heat losses create a constantly fluctuating substrate-heating environment. As the temperatures are increased, conductive heat losses become more pronounced, exacerbating the heat non-uniformity within the substrate-heating environment. Moreover, conventional thermal chambers are often very large to accommodate the substrate perimeter, further exacerbating the heating issues by increasing the area and volume to be heated. For example, as the demand for larger computer displays, monitors, flat-screen televisions, and the like increases, a typical substrate may be 620 mm by 750 mm, or larger. For instance, substrates of 1 meter by 1 meter are contemplated. Typically, to compensate for the larger substrates, larger chamber volumes, and the subsequent increase in heat losses, more heating elements are used, thereby increasing the cost of the equipment, energy usage and temperature non-uniformity. As temperatures increase, copper heating elements are often employed to offset energy costs and provide efficient heating. Copper heaters are generally more energy efficient than other types of heating elements. Unfortunately, as the temperatures are increased, copper atoms from the copper heaters often escape into the thermal chamber and contaminate the film. Thus, traditional thermal chambers and heating processes do not provide acceptably uniform and contaminant-free substrate heating for an efficient and cost effective substrate heating process.

Various contaminants are produced during use of thermal chambers. Many contaminants are formed as new parts (e.g., cables, O-rings and sheet metal) are substituted into thermal chamber and initially heated. Contaminants are outgassed, created and/or vaporized while the chamber is hot. Often, contaminants are deposited as residue to chamber surfaces with the lowest temperatures. The surfaces are usually in distant regions of the chamber and are hard to reach when cleaning the chamber. Cleaning entails disassembling the thermal chamber, removing the residue from the contaminated parts and reassembling the chamber. This procedure generally can consume three days and multiple cycles are repeated to assure removal of all contaminates. Contaminates interfere with production by reducing product quality, reducing product throughput and adding cost.

Therefore, there is a need for a method and apparatus for uniformly heat processing a plurality of substrates in an efficient, contaminate-free thermal processing system. Furthermore, there is a need for a method and apparatus to confine and easily remove contaminates from the system.

SUMMARY OF THE INVENTION

Embodiments of the invention generally provide an apparatus for heating substrates, comprising a chamber having a heater disposed within the chamber with a plurality of heated supports movably disposed within the chamber to support at least two substrates thereon and a contamination collector disposed in communication with the chamber.

Other embodiments of the invention generally provide an apparatus for heating substrates, comprising a chamber having a cavity with at least one cassette having a plurality of heated supports disposed within the cavity to support a plurality of substrates, a heating layer disposed within the cavity and positioned to provide radiant heat to the at least one cassette and a contamination collector for accumulating contaminates from within the chamber.

In another embodiment of the invention, a method for removing contaminates within a chamber, comprising supporting a plurality of substrates on a plurality of heated supports within the chamber, providing a process temperature between about 200° C. and about 1000° C., providing a vacuum within the chamber and depositing contamination upon a contamination collector coupled to the chamber.

BRIEF DESCRIPTION OF THE DRAWINGS

So that the manner in which features of recited embodiments of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 13A–13B are perspective views of the movable member with varied input and output nozzles.

DETAILED DESCRIPTION

Embodiments of the invention have particular advantages in a multi-chamber processing system also known as a cluster tool, commonly used in the semiconductor industry and well suited for supporting the substrate-thermal chamber described herein. A cluster tool is a modular system comprising multiple chambers that perform various functions including substrate heating, center-finding and orientation, annealing, deposition and/or etching. The multiple chambers are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool.

Figure 1:
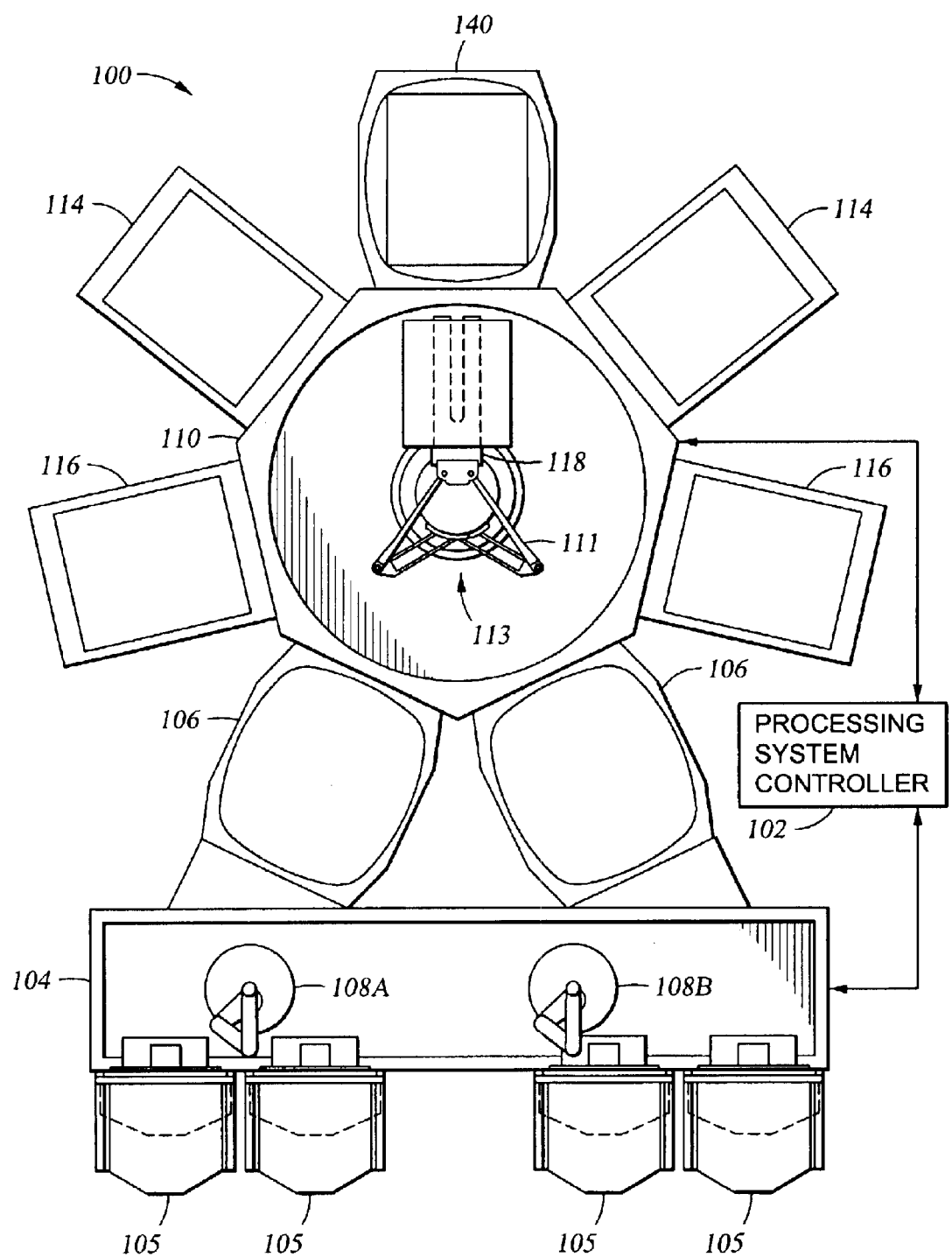
FIG. 1 is a plan view of an exemplary processing system including a thermal chamber of the invention.

FIG. 1 is a plan view of a typical processing system 100 for semiconductor processing wherein the invention may be used to advantage. Processing system 100 generally comprises a plurality of chambers and robots and is preferably equipped with process system controller 102 programmed to perform the various processing methods accomplished by the processing system 100. Front-end environment 104 is shown positioned in selective communication with a pair of load lock chambers 106. Pod loaders 108A-B disposed in front-end environment 104 are capable of linear, rotational, and vertical movement to shuttle substrates between load locks 106 and plurality of pods 105 which are mounted on front-end environment 104.

Load locks 106 provide a first vacuum interface between front-end environment 104 and transfer chamber 110. Two load locks 106 are provided to increase throughput by alternatively communicating with transfer chamber 110 and front-end environment 104. Thus, while one load lock 106 communicates with transfer chamber 110, a second load lock 106 communicates with front-end environment 104.

Robot 113 is centrally disposed in transfer chamber 110 to transfer substrates from load locks 106 to one of the various processing chambers 114 or holding chambers 116. Processing chambers 114 are adapted to perform any number of processes such as film deposition, annealing, etching and the like, while holding chambers 116 are adapted for orientation, cool down and the like. Thermal chamber 140 used to heat substrates during a heat process such as hydrogen removal and annealing is disposed within processing system 100. Thermal chamber 140 is located typically disposed within processing system 100 in the most efficient processing position but may be located anywhere within processing system 100. For example, the heating process step may follow a deposition process step. Therefore, to minimize the movement of robot 113, thermal chamber 140 may be located adjacent to one of processing chambers 114 used for a deposition process step.

Figure 2:
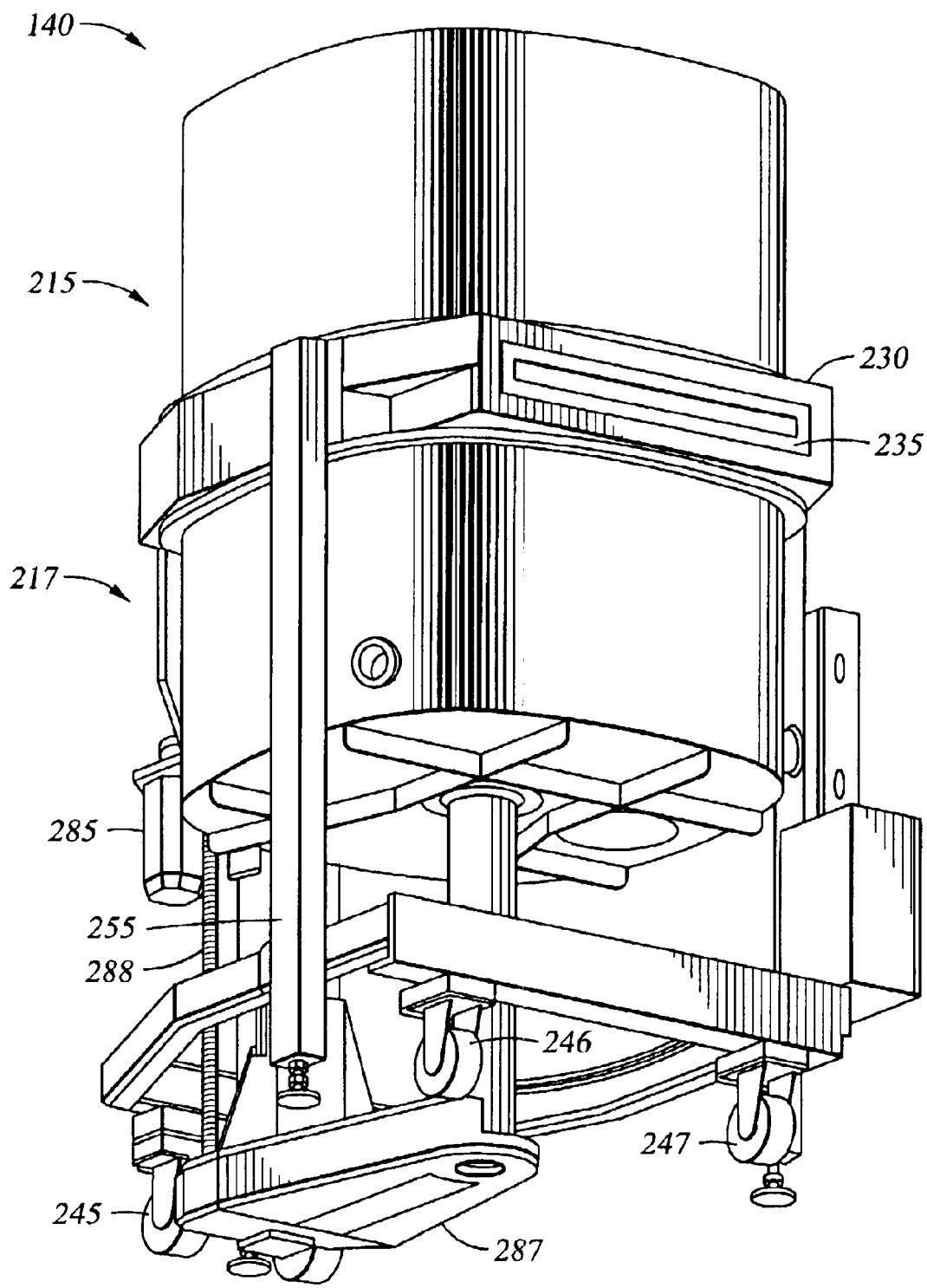
FIG. 2 is a perspective view of one embodiment of a thermal chamber.

FIG. 2 is a perspective view of thermal chamber 140 comprising upper section 215 (e.g., upper bell jar) and lower section 217 (e.g., lower bell jar) where upper section 215 is separated from lower section 217 by connecting body 230 having loading window 235. Upper and lower sections 215, 217 are sealably attached to and generally symmetrical and coaxial about connecting body 230. Upper section 215 and lower section 217 can be sealed to connecting body 230 using frictional fit, using sealing materials such as gaskets or putty adapted to withstand high temperatures, or by using adhesives such as pressure sensitive adhesives, ceramic bonding, glue and the like that are process resistant and free of contaminates, such as copper. Upper section 215 and lower section 217 may be connected to connecting body 230 by conventional means such as welding or by using bolts, clamps or other fasteners as are known in the art.

Thermal chamber 140 is mounted on mounting frame 255 to provide support for upper section 215 and lower section 217. In one aspect, mounting frame 255 may comprise rotatably mounted casters 245, 246 and 247 on a lower end for moving thermal chamber 140. Mounting frame 255 may be attached to thermal chamber 140 and connecting body 230 by conventional means such as bolts, clamps or other fasteners as are known in the art. While thermal chamber 140 is preferably mounted on frame 255, thermal chamber 140 may be mounted to and supported by transfer chamber 110 using fasteners such as screws, bolts, clips and the like.

Motor 285 used with the transportation of substrates within thermal chamber 140, may be attached to thermal chamber 140 using fasteners such as screws, bolts, clips and the like. Motor 285 is rotatably coupled to lead screw 288. Lead screw 288 is rotatably coupled to platform 287 slidably coupled to frame 255. When lead screw 288 is rotated by motor 285, platform 287 is vertically raised or lowered.

In one embodiment, a thermal insulating layer (not shown) may be used to enclose or wrap thermal chamber 140 to minimize heat loss. The thermal insulating layer may comprise insulators such as fiberglass, ceramic fiber, asbestos or other materials adapted to provide insulation from heat loss. In one embodiment, the insulating layer comprises a flexible insulating ceramic fiber blanket having a thermal conductivity of less than about 0.035 W/m/° C. and stabilizes at a surface temperature of about 30° C.

Figure 3:
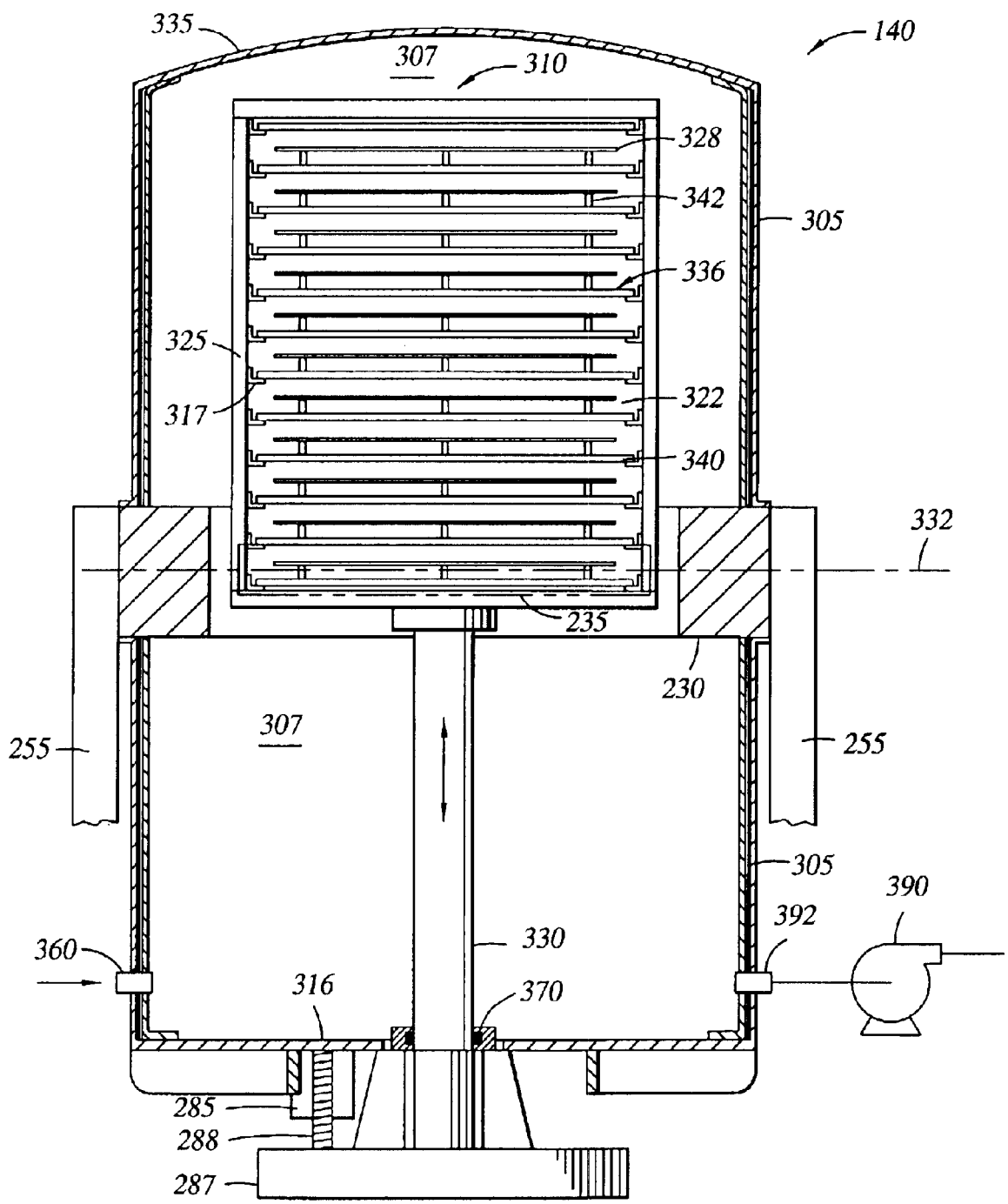
FIG. 3 is a partial cross-sectional view of a thermal chamber illustrating an upper and lower bell jar configuration.

FIG. 3 is a cross-section of one embodiment of thermal chamber 140 of the invention adapted for substrate heat processing. Thermal chamber 140 comprises body 305, lid 335 and bottom 316 disposed on body 305 and defining cavity 307 for heating a plurality of substrates 328 therein. In one aspect, body 305 is formed of process resistant materials such as aluminum, steel, nickel and the like, adapted to withstand process temperatures and is generally free of contaminates, such as copper. Body 305 may comprise gas inlet 360 extending into cavity 307 for connecting thermal chamber 140 to a process gas supply (not shown) for delivery of processing gases therethrough. In another aspect, vacuum pump 390 may be coupled to cavity 307 through a vacuum port 392 to maintain a vacuum within cavity 307.

Substrate cassette 310 is movably disposed within cavity 307 and is coupled to an upper end of movable member 330. Movable member 330 can be used as a contamination collector. Movable member 330 is comprised of process resistant materials such as metals including steel (i.e., stainless, hardened or plated), aluminum, nickel, chromium, tin, palladium, platinum, tantalum, tungsten, titanium, combinations thereof and alloys of these aforementioned metals, as well as non-metals, such as ceramics, glasses, quartz, resins and polymeric materials. Stainless steel and hardened steel are preferred materials for movable member 330 in some embodiments. In another embodiment, nickel-plated, hardened steel is a preferred material for movable member 330. The process resistant materials are adapted to withstand process temperatures and generally free of contaminates, such as copper. Movable member 330 enters cavity 307 through the bottom 316. Movable member 330 is slidably and sealably disposed through seal 370 (i.e., lip or differential) at bottom 316 and is raised and lowered by platform 287. Platform 287 supports a lower end of movable member 330 such that movable member 330 is vertically raised or lowered in conjunction with the raising or lowering of platform 287. Movable member 330 vertically raises and lowers cassette 310 within cavity 307 to move substrates 328 across substrate transfer plane 332 extending through window 235. Substrate transfer plane 332 is defined by the path along which substrates are moved into and out of cassette 310 by robot 113.

Cassette 310 comprises a plurality of substrate-heating shelves 336 supported by frame 325. Although in one aspect, FIG. 3 illustrates twelve substrate-heating shelves 336 within cassette 310, it is contemplated that any number of shelves may be used. Each substrate-heating shelf 336 comprises heated substrate support 340 (e.g., heating plate) connected by brackets 317 to frame 325. Brackets 317 connect the edges of heated substrate support 340 to frame 325 and can be attached to both frame 325 and heated substrate support 340 using adhesives such as pressure sensitive adhesives, ceramic bonding, glue and the like, or fasteners such as screws, bolts, clips and the like that are process resistant and free of contaminates, such as copper. Frame 325 and brackets 317 are comprised of process resistant materials such as ceramics, aluminum, steel, nickel and the like that are process resistant and are generally free of contaminates, such as copper. While frame 325 and brackets 317 can be separate items, it is contemplated that brackets 317 may be integral to the frame 325 to form support members for heated substrate supports 340. While, in one aspect, heated substrate supports 340 are conformal to and slightly larger than substrates 328 to maximize heating efficiency by applying a majority of the heat to substrate 328, it is contemplated that heated support 340 may be of any shape adapted to provide desired substrate heating. For example, in one embodiment heated support 340 may be considerably larger than substrate 328 to ensure that substrate 328 is fully exposed to the heat from support 340. Alternatively, heated support 340 may be formed to accommodate substrates 328 of various sizes.

Substrate-heating shelves 336 are spaced vertically apart and parallel within cassette 310 to define a plurality of substrate-heating spaces 322. Each substrate-heating space 322 is adapted to heat at least one substrate 328 therein supported on a plurality of support pins 342. Substrate-heating shelves 336 above and below each substrate 328 establish the upper and lower boundary of substrate-heating space 322 such that the top and bottom sides of substrate 328 are exposed to heat. In one embodiment, the upper and lower boundaries are equidistant from substrate 328 in order to ensure uniform heating of both sides of substrate 328. To ensure heating of a top substrate 328 in cassette 310, the upper boundary for top heating space 322 is established by empty heated substrate support 340. In another embodiment, the spacing and substrate position may be adjusted to accommodate different heating requirements for different processes such as annealing, hydrogen removal, and the like. The spacing between the upper and lower boundary of heating space 322 may be adjusted to increase or decrease the rate of heating, and the amount of heat applied to each substrate side. For example, the spacing between the upper and lower boundary of heating space 322 can be spaced more narrowly to increase the radiant energy from heated substrate supports 340 to thereby increase the temperature and rate of heating, or spaced further apart to reduce the incident radiant energy, thereby lowering the substrate temperature and slowing the heating of substrate 328. Moreover, substrate 328 may be positioned closer to either the upper or the lower boundary to provided differing amounts of heating to either side of substrate 328. In one aspect, to increase production efficiency, the spacing between the upper and lower boundary of heating space 322 may be adjusted to heat substrate 328 at a desired rate and temperature while allowing cassette 310 to hold as many substrate-heating shelves 336 as possible. In one aspect, the spacing between the upper and lower boundary is about 45 mm. The inventors believe that the about 45 mm spacing between the upper and lower boundary provides for adequate space to receive substrate 328, uniform substrate heating and efficient space utilization within chamber 307 to maximize the number of substrate-heating shelves 336.

Figure 4:
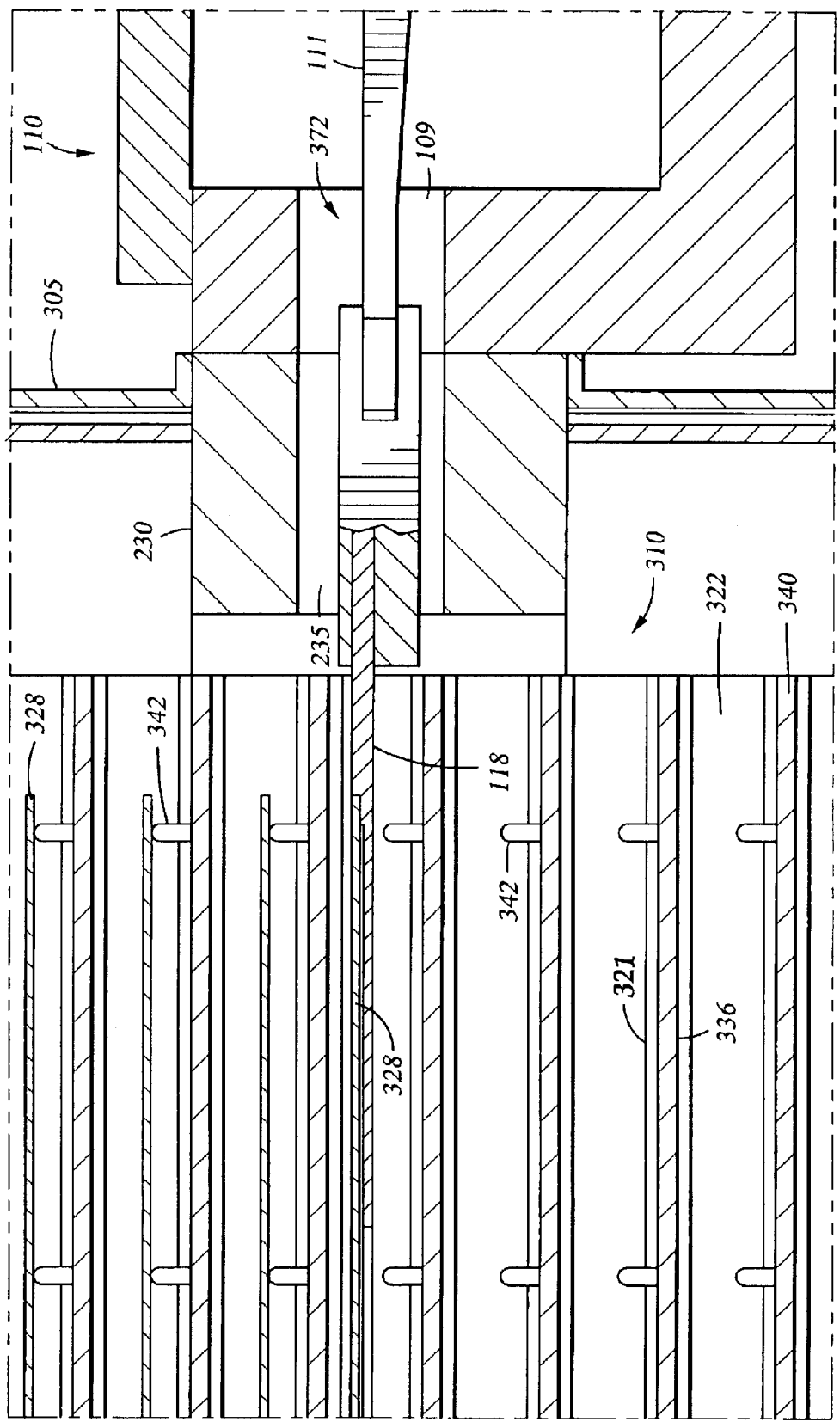
FIG. 4 is a partial cross-sectional view of a thermal chamber and a transfer chamber.

FIG. 4 illustrates a cross-sectional view of thermal chamber 140 and transfer chamber 110. Thermal chamber 140 is positioned so that window 235 is registered with opening 109 formed in the sidewall of transfer chamber 110. In such a position, transfer chamber opening 109 and window 235 define substrate transfer aperture 372 through which substrates 328 may be transferred by robot 113. The substrate transfer aperture 372 is selectively sealed by a sealing apparatus such as a gate valve or slit valve (not shown). During operation, robot 113 receives substrate 328 on blade 118 supported on arms 111 from processing system 100 via transfer chamber 110 through substrate transfer aperture 372. Blade 118 is positioned to deliver substrate 328 to thermal chamber 140 through substrate transfer aperture 372. Cassette 310 is moved vertically up or down to position empty heating space 322 inline with substrate transfer plane 332 to receive substrate 328. Arms 111 are extended through substrate transfer aperture 372 to dispose substrate 328 within thermal chamber 140 and subsequently dispose substrate 328 within cassette 310. Arms 111 extend substrate 328 into heating space 322 and position substrate 328 above pins 342. In one embodiment, cassette 310 moves vertically until pins 342 contact the substrate surface, lifting substrate 328 off blade 118. Subsequently arms 111 and blade 118 are retracted back to transfer chamber 110. In another embodiment, arms 111 and blade 118 move vertically downwardly until substrate 328 contacts pins 342. Arms 111 and blade 118 continue to move downwardly until substrate 328 is fully supported by pins 342.

Figure 5:
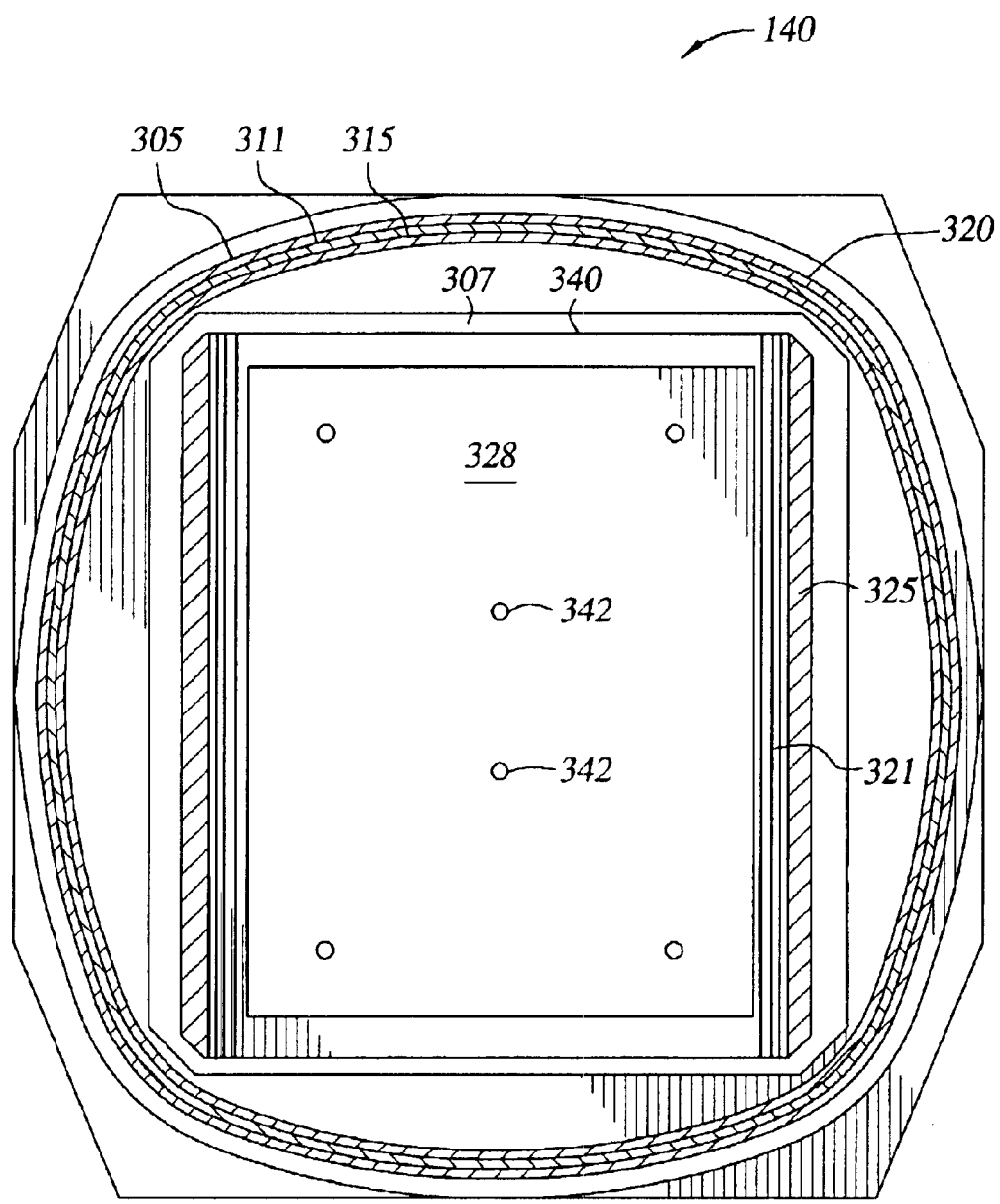
FIG. 5 is a partial cross-sectional view of a thermal chamber illustrating a body, heat reflector and heater.

FIG. 5 is a cross-sectional top view of thermal chamber 140 illustrating one embodiment of the invention. Because cavity 307 holds a plurality of substrates 328, cavity 307 is typically larger in volume than chambers such as processing chambers 114 and holding chamber 116, which usually hold only one substrate 328. Because of the increased volume of cavity 307, external atmospheric pressures on chamber 140 under vacuum may be considerable. To provide structural strength and to minimize the cavity volume, cavity 307 is preferably semi-round in shape and is conformal with and slightly larger than cassette 310. In other embodiments, it is contemplated that the shape of cavity 307 may be round, square or any shape adapted to accommodate substrate 328 and to have sufficient structural integrity to withstand the external atmospheric pressures.

Figure 6:
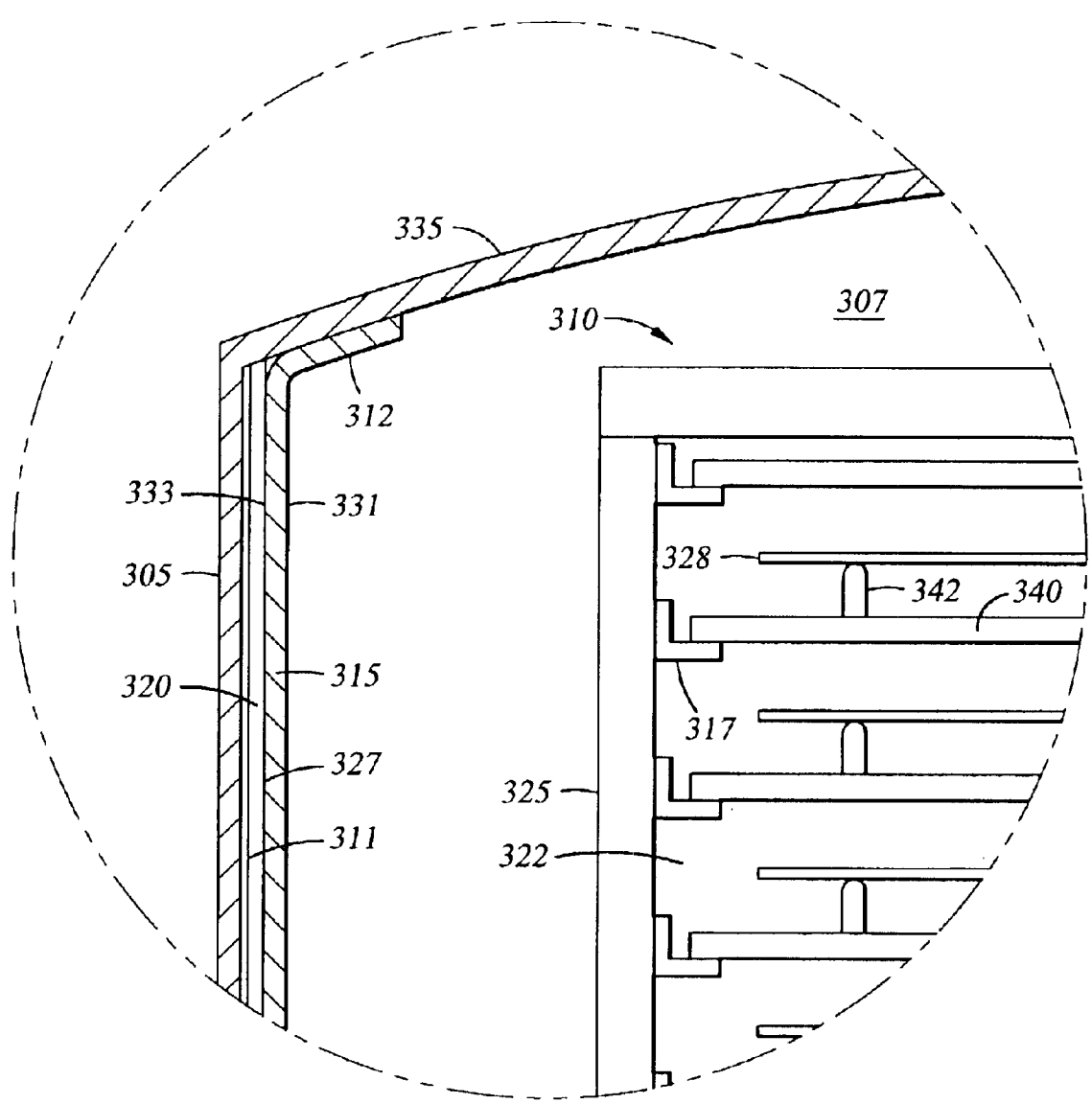
FIG. 6 is a top cross-sectional view of a thermal chamber.

FIG. 6 is a partial cross-sectional view of thermal chamber 140. Heat reflector 320 is disposed within cavity 307 and spaced adjacent inner surface 311 of body 305, forming a reflective surface within cavity 307. The body 305 is substantially cylindrical and lid 335 and bottom 316 are cup shaped to fit over body 305. Heat reflector 320 is adapted to minimize conductive heat losses through body 305 by providing radiant heat insulation between cavity 307 and inner surface 311. Heat reflector 320 reflects radiated heat within cavity 307 away from inner surface 311 and toward the center of cavity 307. Heat reflector 320 may comprise a single layer. Alternatively, heat reflector 320 may comprise multiple layers or several pieces combined to form a unified body. Heat reflector 320 typically comprises heat conductors such as aluminum, nickel, steel, and the like that are process resistant and generally free of contaminates, such as copper. When additional insulation is desired between cavity 307 and inner surface 311, heat reflector 320 comprises insulators such as metal plated ceramics, glass and the like that are process resistant and generally free of contaminates, such as copper. Heat reflector 320 comprises inner heat reflective surface 327 plated with aluminum, nickel, gold or other surfaces adapted to reflect heat and that are process resistant and generally free of contaminates, such as copper. Heat reflector 320 may be attached to inner surface 311 using several methods such as bonding to inner surface 311 using pressure sensitive adhesives, ceramic bonding, glue and the like, or by fasteners such as screws, bolts, clips and the like that are process resistant and generally free of contaminates, such as copper. Additionally, heat reflector 320 can be deposited on inner surface 311 using techniques such as electroplating, sputtering, anodizing, and the like. In one embodiment, heat reflector 320 is spaced from inner surface 311 using insulated fasteners such as insulated screws, bolts, clips, and the like, forming a gap there between inner surface 311 and heat reflector 320.

Heater 315 is disposed within cavity 307 between heat reflector 320 and cassette 310. Heater 315 is adapted to form a heating member conforming to and surrounding cassette 310. Heater 315 comprises one or more heating elements such as resistive heaters and the like disposed within a layer, or layers, of heat conducting materials such as nickel, steel, aluminum and the like that radiate heat. Heater 315 can also include heating lamps. Although, inside surface 331 of heater 315 is preferably bead blasted or anodized to provide a higher heat emissivity to improve the transmission of radiated heat within cavity 307, other types of surface conditioning adapted to provide greater surface emissivity may be used. Outer surface 333 of heater 315 is polished to provide a low emissivity, thereby minimizing the transmission of radiated heat to chamber body 305. During substrate heat processing, heater 315 is activated by a power source (not shown) and heated to a desired temperature. Although, in one aspect, a gap is established between heater 315 and heat reflector 320 to minimize heat transference via conduction to heat reflector 320, heater 315 may be in direct contact with heat reflector 320.

Figure 7:
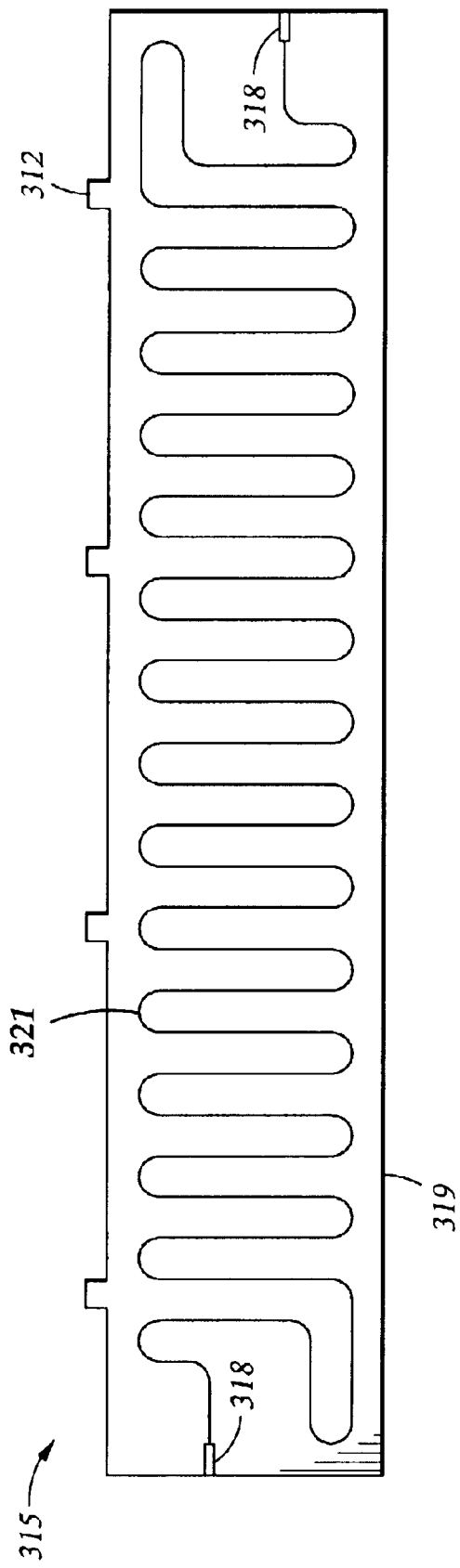
FIG. 7 is a side view of a heater used with a thermal chamber.
Figure 8:
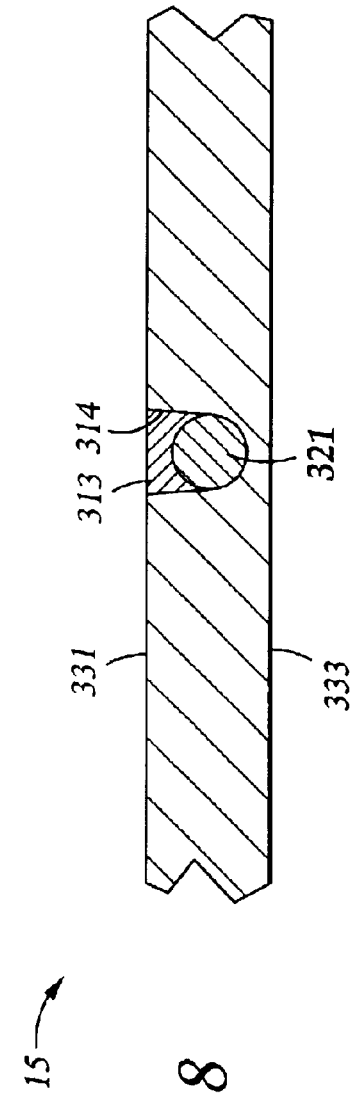
FIG. 8 is a partial cross-section of a heater used with a thermal chamber.

FIGS. 7 and 8 illustrate an embodiment of heater 315. Heater 315 comprises jacket 319 comprising thermally conducting materials such as aluminum, nickel, steel and the like adapted to uniformly radiate heat within cavity 307 and that are process resistant and generally free of contaminates, such as copper. Continuous heating element 321 is disposed within slot 314 formed within jacket 319. Continuous heating element 321 is adapted to radiate heat within jacket 319. Continuous heating element 321 may be secured within slot 314 by frictional fit, by welding, using fill materials 313 generally free of contaminates, such as copper and/or silver, using adhesives (i.e., pressure sensitive adhesives, ceramic bonding, glue and the like) or using fasteners (i.e., screws, bolts, clips and the like) that are process resistant and generally free of contaminates, such as copper. In one embodiment, to provide a tighter fit between jacket 319 and continuous heating element 321, continuous heating element 321 has a higher coefficient of expansion than that of jacket 319. Although, in one aspect, the thermal expansion coefficient ($\alpha$) for continuous heating element 321 is about 17, and the thermal expansion coefficient ($\alpha$) for jacket 319 is about 13 other thermal expansion coefficients may be used to advantage.

A pair of couplings 318 is connected to a power source (not shown), such as an external power supply, to provide power to continuous heating element 321. Although it is preferred that continuous heating element 321 be formed as a unified and homogenous heating member to provide uniform heating throughout jacket 319, a plurality of individual heating elements such as resistive heaters, lamps and the like, may be coupled together to form continuous heating element 321. Additionally, jacket 319 may be heated by a plurality of the individual heaters dispersed and coupled discretely throughout jacket 319.

Heater 315 may be secured within cavity 307 using any of several methods. For example, heater 315 may be attached to inner surface 311 using attachment methods such as bonding using adhesives (e.g., pressure sensitive adhesives, ceramic bonding, glue and the like) or fasteners (e.g., screws, bolts, clips, and the like). Such attachment methods are process resistant and generally free of contaminates, such as copper. In a particular embodiment, heater 315 comprises an upper portion having mounting flange 312 for mounting heater 315 to body 305. Although the mounting flange 312 is generally integral to heater 315, mounting flange 312 may be a separate component. Mounting flange 312 may be attached to body 305 using adhesives such as pressure sensitive adhesives, ceramic bonding, glue, and the like, or fasteners such as screws, bolts, clips and the like that are process resistant and generally free of contaminates, such as copper.

Figure 9:
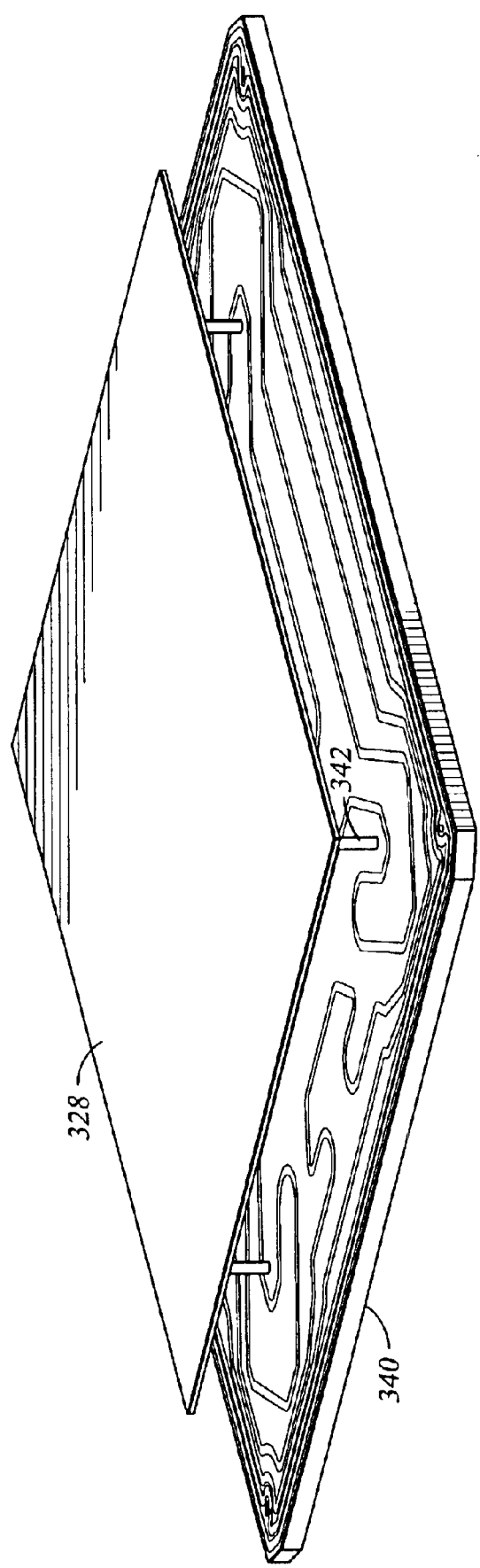
FIG. 9 is a perspective view of a heated substrate support used with a thermal chamber.

FIG. 9 illustrates one embodiment of the invention where heated substrate support 340 and support pins 342 space and support substrate 328 thereon forming a lower portion of heating space 322. Although, in one aspect, the number of support pins 342 is at least six, having four support pins 342 spaced substantially uniformly on the substrate outer periphery to fully support the edges and two support pins 342 adjacent the middle of substrate 328, as illustrated in FIG. 5. Alternatively, any number of support pins 342 may be used in any configuration adapted to support substrate 328. Supporting pins 342 preferably comprises insulators such as polymers, ceramics and the like with a cross section adapted to minimize contact with substrate 328 and to prevent conduction between heated substrate support 340 and substrate 328. For additional supporting strength supporting pins 342 may also comprise conductors such as steel, aluminum, nickel and the like having a sufficiently small surface area to minimize conduction, that are process resistant, and generally free from contaminates, such as copper. While in one embodiment, support pins 324 comprise a pointed tip to minimize contact with substrate 328, support pins 342 may have any tip cross section and profile adapted to support substrate 328 such as rounded tip, square tip, flat tip and the like adapted to minimize heat conduction to heated substrate support 340.

Figure 10:
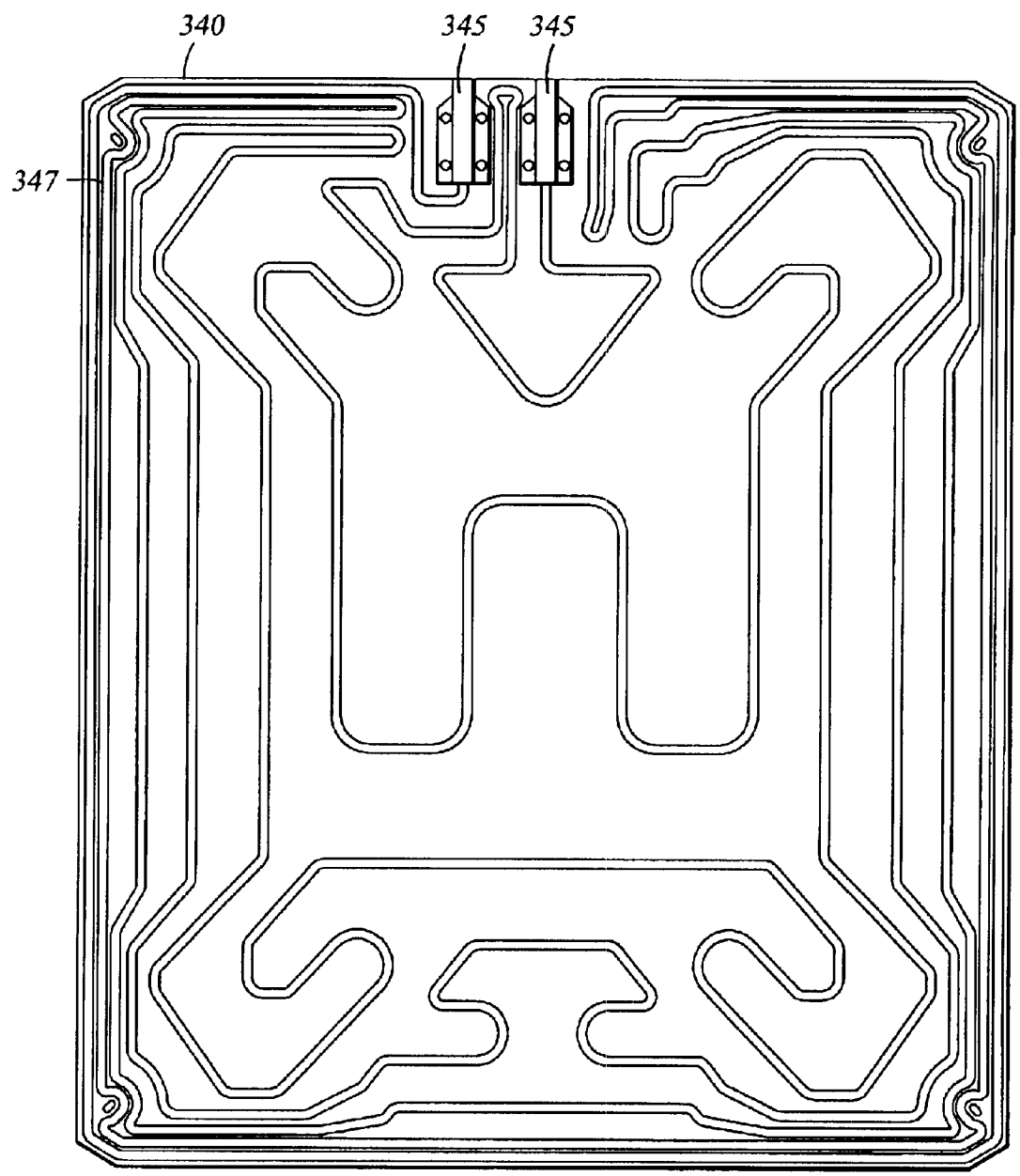
FIG. 10 is a top view of a heated substrate support used with a thermal chamber.

FIG. 10 is a top view of heated substrate support 340 comprising a plurality of plate heaters 347 disposed within a layer of thermally and electrically insulating material such as fiberglass, glass, ceramic, asbestos and the like. Plate heaters 347 may be resistive heaters, radiant lamps and the like. Plate heaters 347 may be activated by power supplied by a power source (not shown) such as an external power supply coupled through connectors 345. Typically, the temperature across the substrate surfaces varies as a function of the substrate body heat migration due to convection and conduction within chamber 140, proximity to heated substrate support 340, support pins 342, heater 315 and the overall thermal profile within cavity 307. In one embodiment, plate heaters 347 are patterned to provide a radiant heating profile to match and compensate for substrate thermal losses, i.e., the substrate heat loss profile. For example, plate heaters 347 illustrated in FIG. 10 are spaced closer together near the corners than the middle of heated substrate support 340 to provide more concentrated heat to the corners and edges of substrate 328 where a substantial amount of conductive and/or radiated heat loss occurs. Although, heat typically tends to radiate from the substrate edges, it is contemplated that the patterned heating profile may be adapted to encompass any variation in the substrate heat loss profile. For example, plate heaters 347 may be adapted to provide a variable amount of heat output by varying their size, spacing, resistivity, illumination, input power and the like to more closely fit the substrate heat loss profile. Moreover, heated substrate support 340 is spaced from substrate 328 by support pins 342 as shown in FIGS. 3, 4 and 6 to allow the radiated heat between the lower surface of substrate 328 and upper surface of the heated support to intermix. Although, in one aspect, the spacing between heated substrate support 340 and substrate 328 is about 20 mm, other spacings are contemplated. Although it is believed that the radiant heat from heated substrate support 340 intermixes before heating substrate 328, thereby minimizing hotspots defined by the plate heater configuration, it is also contemplated that substrate 328 may be laid directly on heated substrate support 340 with plate heaters adapted to substantially match the substrate heat loss profile.

In operation, thermal chamber 140 heating process is initiated by robot 113 placing substrate 328 via window 235 within cavity 307 on heated substrate support 340. An inert process gas, such as nitrogen, is flowed into cavity 307 through gas inlet 360 and is maintained at a required chamber pressure by vacuum pump 390. Alternatively, the process gas may be an active process gas, such as fluorine, adapted for a particular process. Cavity 307 is heated with radiant heat by heater 315 and heated substrate support 340 or heater 315 alone, in cooperation with heat reflector 320, to a desired ambient level sufficient to provide a uniform substrate heating profile. Individual substrates 328 are uniformly heated to a substrate body temperature between about 350° C. to about 600° C. The temperature variation referenced to a temperature on the substrate body (i.e., normalized temperature variation) is about between +/−5° C. and about +/−10° C.

Figure 11:
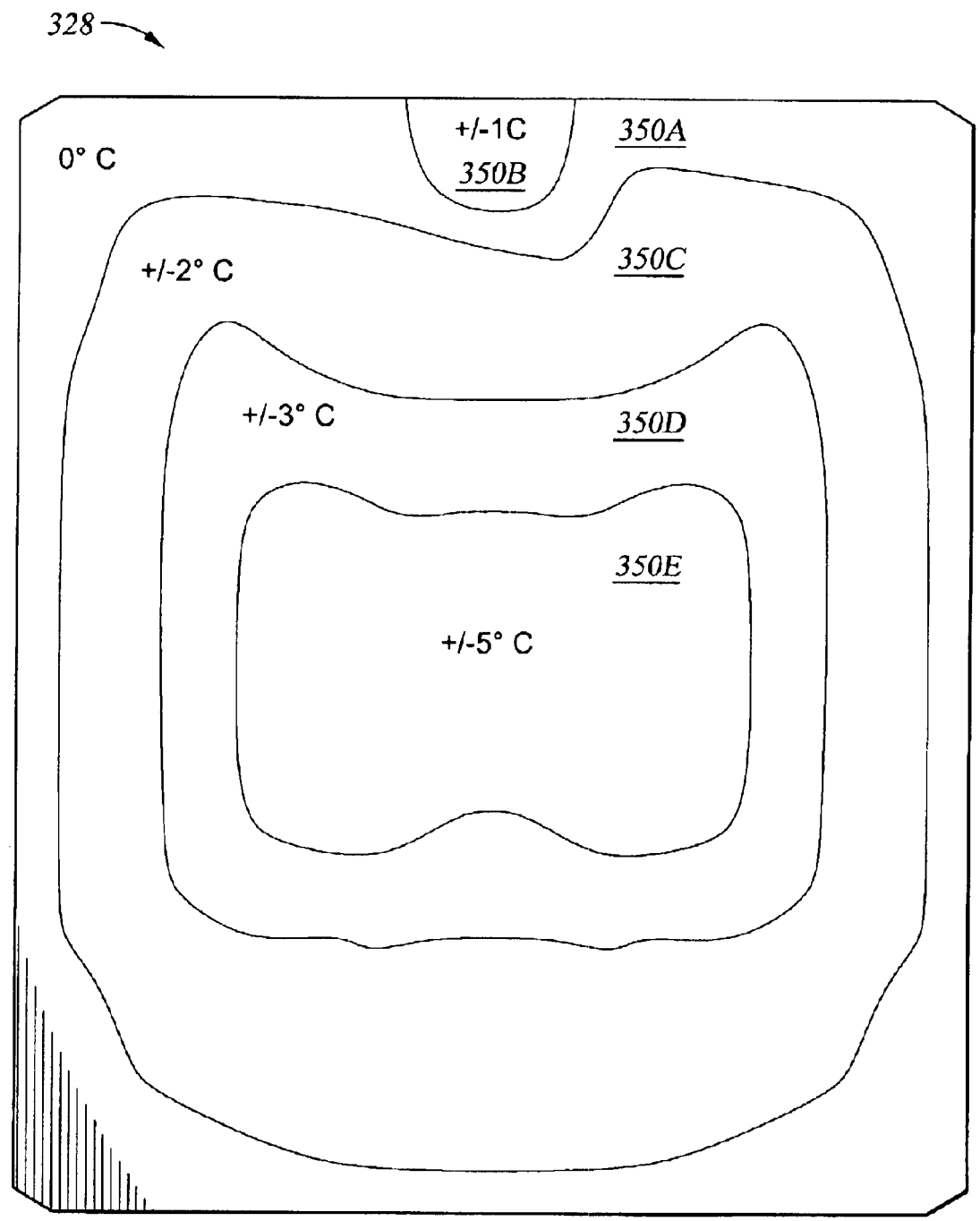
FIG. 11 is a temperature contour of a substrate undergoing heat treatment within a thermal chamber.

For example, in an embodiment of the invention, thermal chamber 140 heating process is initiated by robot 113 placing substrate 328 via window 235 within cavity 307 on heated substrate support 340. A vacuum within cavity 307 is provided by vacuum pump 390 at about 0 to about 0.5 Torr. A process gas such as nitrogen is flowed into cavity 307 through gas inlet 360 and is maintained at chamber pressure at about 0.0 Torr to about 0.5 Torr by vacuum pump 390. Heat is applied to the substrates via heater 315 and heated supports 340 to heat each substrate uniformly to a temperature of about 450° C. to about 600° C. each. Each substrate maintains a normalized heating profile of about +/−5° C. at a substrate body temperature of about 450° C. to about +/−10° C. at a substrate body temperature of about 600° C. For example, FIG. 11 is an illustrative temperature contour map of substrate 328 illustrating the normalized temperature variation across the body of substrate 328, using the perimeter temperature as the normalizing value, during heat processing at about 500° C. Region, 350A, is the reference region and therefore has a zero temperature variance. Region, 350B, has about a +/−1° C. normalized temperature variation. Region 350C has about a +/−2° C. normalized temperature variation. Region 350D has about a +/−3° C. normalized temperature variation. Region 350E has about a +/−5° C. normalized temperature variation. Thus, the normalized temperature variation across substrate 328 is about +/−5° C.

Various contaminants are produced during use of the thermal chamber. Many contaminants are formed as new parts (e.g., cables, O-rings and sheet metal) are substituted into the chamber and initially heated. Some contaminates are derived from production processes, such as evolving from substrates. Contaminates include plasticizers, salts, carbon, organic compounds and inorganic compounds. Additionally, contaminants are outgassed, created and/or vaporized while the thermal chamber is hot, i.e., the process temperature is in the range from about 200° C. to about 1000° C. In some embodiments, the process temperature is from about 450° C. to about 600° C. and often at about 500° C. Contaminants that are freed during processing are generally deposited as residue onto surfaces in the chamber. Often, the deposition of contaminates occurs as surfaces of the chamber are below 150° C. and such cool surfaces cause contaminant adsorption or condensation.

Figure 12A:
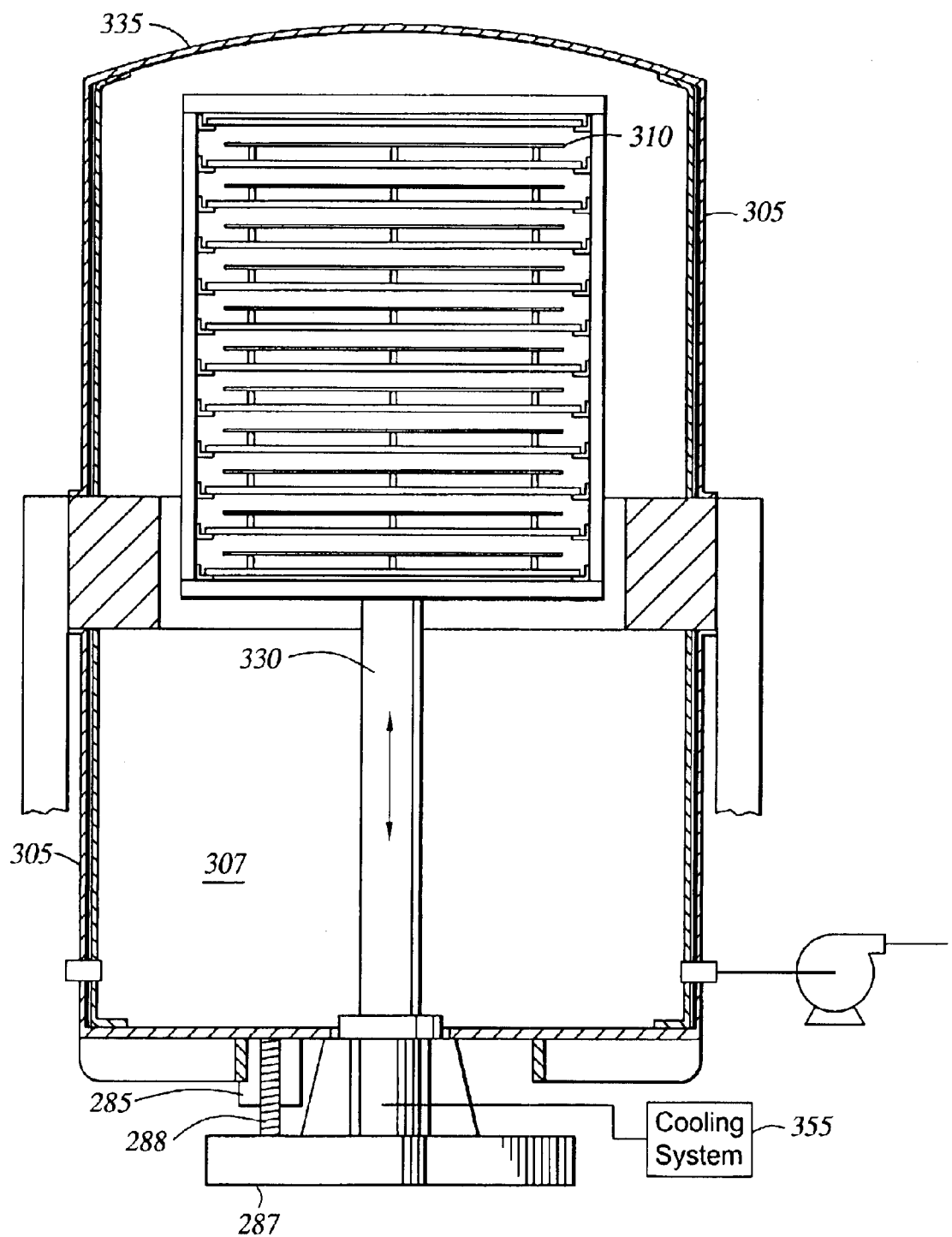
FIGS. 12A–12B are cross-sectional views of the thermal chamber with the cassette in an up position and in a down position.
Figure 12B:
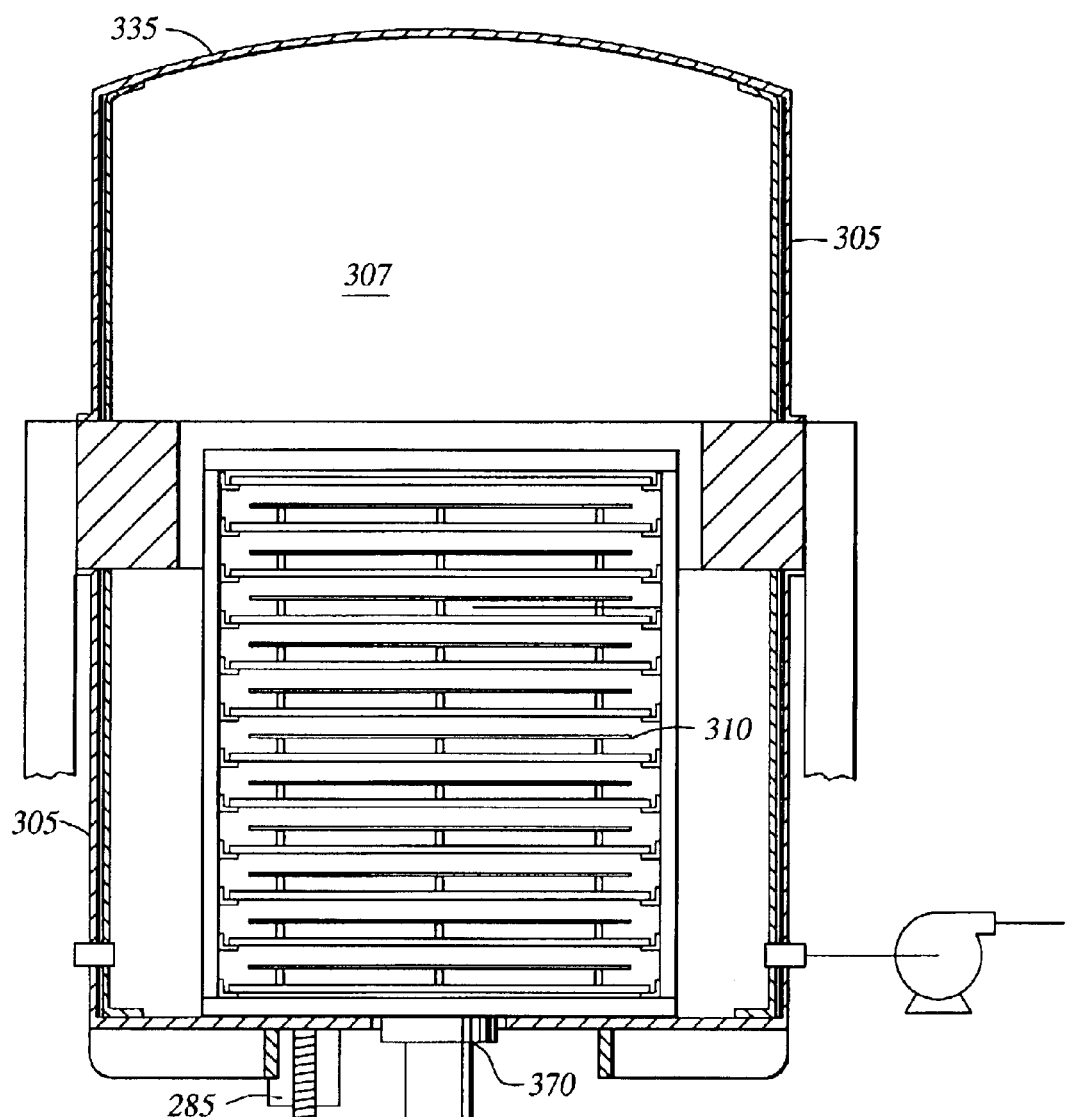

In FIG. 12A, platform 287 and movable member 330 are in the up-position. Consequently, cassette 310 is raised into the upper portion of body 305, empty space in cavity 307 is increased in the lower portion of body 305 and movable member 330 is mostly located within cavity 307. FIG. 12B depicts platform 287 and movable member 330 in the down-position. Therefore, cassette 310 is in the lower portion of body 305, the empty space of cavity 307 is increased within the upper portion of body 305 and movable member 330 is mostly located outside cavity 307. Embodiments of the invention teach processes to utilize movable member 330 as a condenser or collector on which contaminates are attracted.

In FIG. 13A, movable member 330 has surface 374, nozzles 375 and tubing 376. By flowing a coolant through movable member 330, the operating temperature of surface 374 can be reduced to be the coolest surface within the thermal chamber. Therefore, volatized contaminates condense or are collected upon surface 374. The operating temperature of surface 374 is generally less than about 200° C. In some embodiments the operating temperature is between 200° C. and 0° C. and in further embodiments, the temperature is set below 0° C. Generally, the thermal chamber is run at about 500° C. However, the thermal chamber has a range of use from about 200° C. to about 1000° C. and surface 374 needs only to be cooler than the thermal chamber in order to collect contaminates. In another embodiment, the operating temperature of surface 374 is less than about 100° C. and in further embodiments, less than about 70° C. In some embodiments, surface 374 maintains seal 370 at or near the operation temperature and inhibits seal 370 from deteriorating, since the operation temperature of movable member 330 is cooler than the process temperature of the chamber.

When movable member 330 is in the up-position, contaminates throughout cavity 307 condense and are deposited onto surface 374. Contaminates remain on surface 374 until the cleaning process has started. A cleaning process is initiated by lowering movable member 330 to the down-position and exposing movable member 330 outside of cavity 307. While in the down-position, the environment of cavity 307 remains intact as seal 370 maintains the pressure and contents of cavity 307.

Contaminates are removed from surface 374 by physical (scrubbing) and/or solution (washing) processes. A solution can be an aqueous solution and/or an organic solution and be neat or include additives such as surfactants, soaps, stabilizers or emulsifiers. Solutions include solvents, such as water, alcohols (i.e., isopropanol, methanol, ethanol or butanol), ketones (i.e., acetone or methyl ethyl ketone), tetrahydrofuran, pyridine, N-methylpyrrolidone, aromatics (i.e., benzene or toluene), ethers, glycols (i.e., propylene glycol or ethylene glycol), glycol ethers, alkanes (i.e., pentane, hexane, heptane or octane) and combinations thereof. In another embodiment, contaminates are removed from surface 374 by physical or scrubbing processes, such as scraping, filing, wiping or sanding. Cleaning processes can be manual or automated.

Once contaminates are removed from surface 374, movable member 330 is raised into the up-position and regular use of the thermal chamber can resume. Depending on the amount of contaminates formed or expelled in the cavity from new parts, multiple cycles of the process can be conducted. Generally, most contaminates are removed after 1–3 cycles are completed.

The embodiment of movable member 330 in FIG. 13B contains nozzles 375 on the same end, instead of on opposite ends, as in FIG. 13A. Nozzles 375 can be inputs or outputs, depending on the direction of fluid flow from cooling system 355. Nozzles 375 can be made of materials comprised of process resistant materials such as metals including aluminum, steel, nickel, palladium, platinum, tantalum, tungsten, titanium and alloys of these aforementioned metals, as well as non-metals, such as ceramics, glasses, quartz, resins and polymeric materials. The process resistant materials are adapted to withstand process temperatures and generally free of contaminates, such as copper. In some embodiments, nozzles 375 are formed from the same material as movable member 330, i.e., nozzles 375 and movable member 330 are made of steel. In other embodiments, nozzles 375 are derived from different material than movable member 330, i.e., nozzles 375 are made from aluminum and movable member 330 is made from steel.

Tubing 376 can be made of materials comprised of process resistant materials used in tubes and hoses such as Teflon®, rubbers, polymeric compositions, plastics, metal and combinations thereof. Tubing 376 can be held to nozzles 375 alone or with the aid of a connector or fastener, such as clamp, wire, tape, strap, glue, epoxy and others. Tubing 376 can be connected to nozzles 375 via fittings, such as from Swagelok®. Nozzles 375 are connected to cooling system 355 via tubing 376 to maintain the operating temperature. Many varieties of cooling systems can be used to cool surface 374 including a circulating system (recycling or single pass) containing fluids (e.g., supercritical), liquids, gases and combinations thereof, including water, glycols, alcohols, organic compounds, carbon dioxide, air, nitrogen, argon, solvents and combinations thereof. In some embodiments, process-cooling water (PCW) is circulated through movable member 330 to remove energy from surface 374 until operating temperature is reached. The cooling system 355 can remain at the operating temperature of surface 374.

Figure 14:
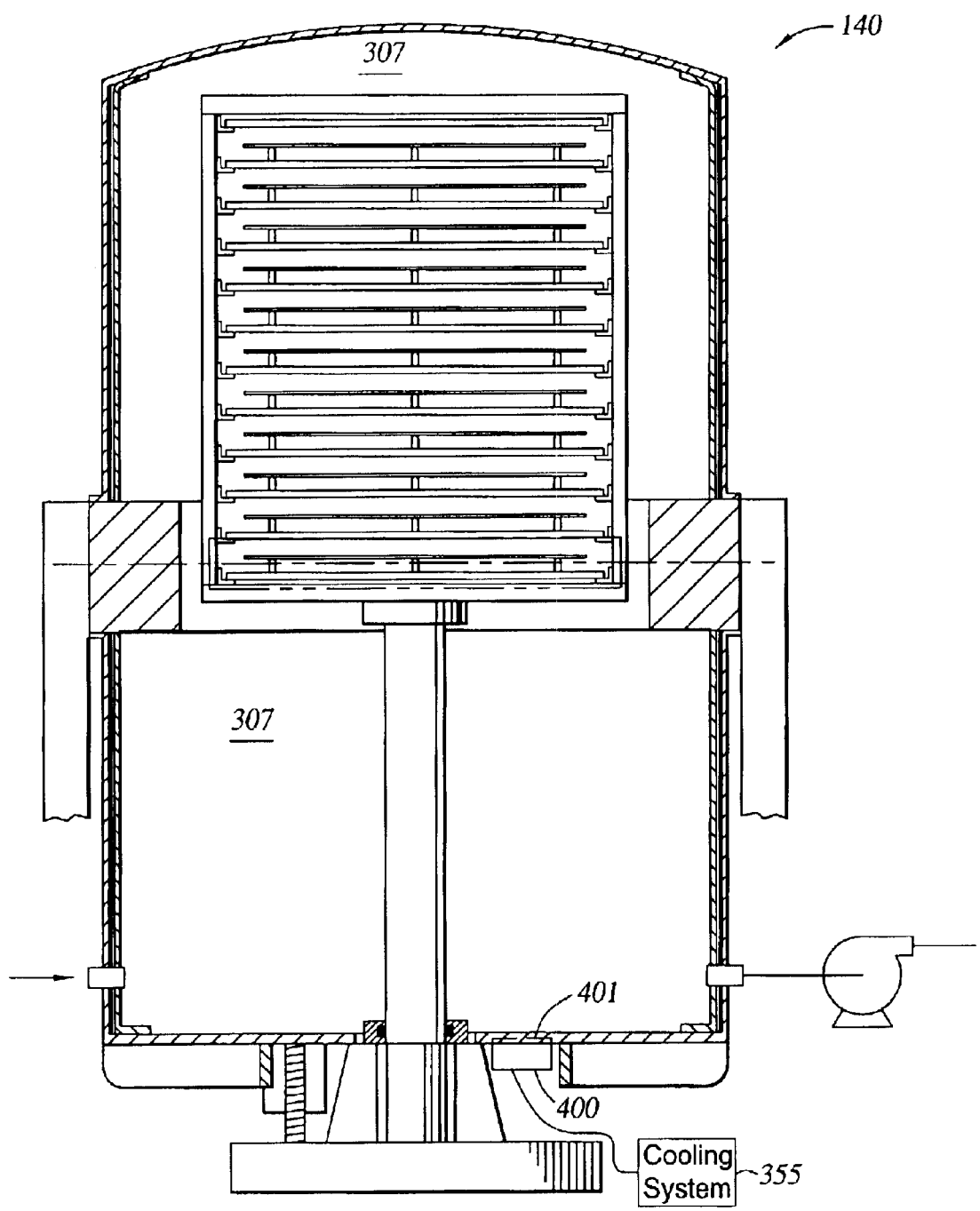
FIG. 14 is a cross-sectional view of the thermal chamber with a secondary chamber for contamination collecting.

In another embodiment of the invention, a contamination collector includes a secondary chamber protruding from the thermal chamber 140, as depicted in FIG. 14. Secondary chamber 400 can be isolated from cavity 307 via shutters 401 (such as flaps, doors or the alike). The contamination collector removes contaminates from cavity 307 once shutters are opened and the temperature of secondary chamber 400 is reduced to less than operating temperature of the thermal chamber. Contamination is drawn from the thermal chamber to secondary chamber 400 and collected. The temperature of secondary chamber 400 can be controlled with cooling system 355 or simply by ambient air. A fan or blower can be used when secondary chamber 400 is cooled with air. Shutters 401 are closed once the contamination collection process is complete. Secondary chamber 400 can have a shutter or door opened from outside thermal chamber 140. The inside of the secondary chamber is cleaned via a cleaning process. In another aspect of the embodiment, secondary chamber 400 can be removed from thermal chamber 140 and cleaned via a cleaning process. In another aspect of the invention, contamination is collected and stored within secondary chamber 400 and is periodically cleaned from inside thermal chamber 140, perhaps during production downtime.

While foregoing is directed to the embodiments of the invention, other and further embodiments of the invention may be devised without departing from the basic scope thereof, and the scope thereof is determined by the claims that follow.

What is claimed is:

1. Apparatus for heating substrates, comprising:
   a heater disposed within a chamber;
   a plurality of heated supports movably disposed within the chamber to support at least two substrates thereon; and a contamination collector disposed in communication with the chamber, wherein the contamination collector is movably disposed between inside the chamber and outside the chamber.

2. The apparatus of claim 1, wherein the contamination collector comprises a process resistant material.

3. The apparatus of claim 2, wherein the process resistant material comprises at least one metal.

4. The apparatus of claim 3, wherein the at least one metal is selected from the group consisting of steel, stainless steel, hardened steel, nickel-plated steel, aluminum, nickel and chromium.

5. The apparatus of claim 1, wherein a cooling system is disposed in communication with the contamination collector.

6. The apparatus of claim 5, wherein the cooling system includes water, glycols, alcohols or air.

7. Apparatus for heating substrates, comprising:
  a heater disposed within a chamber;
  a plurality of heated supports movably disposed within the chamber to support at least two substrates thereon; and
  a contamination collector disposed in communication with the chamber, wherein the contamination collector is a second chamber.

8. The apparatus of claim 7, wherein a cooling system is disposed in communication with the contamination collector.

9. The apparatus of claim 8, wherein the cooling system includes water, glycols, alcohols or air.

10. Apparatus for heating substrates, comprising:
  a heater disposed within a chamber;
  a plurality of heated supports movably disposed within the chamber to support at least two substrates thereon; and
  a contamination collector disposed in communication with the chamber, wherein the contamination collector is a support member for the plurality of heated supports.

11. The apparatus of claim 10, wherein the support member is coupled to an actuator for moving the plurality of heated supports.

12. Apparatus for heating substrates, comprising:
  a chamber having a cavity;
  at least one cassette having a plurality of heated supports disposed within the cavity to support a plurality of substrates;
  a heating layer disposed within the cavity and positioned to provide radiant heat to the at least one cassette; and
  a contamination collector for accumulating contaminates from within the chamber, wherein the contamination collector is movably disposed between inside the chamber and outside the chamber.

13. The apparatus of claim 12, wherein the contamination collector comprises a process resistant material.

14. The apparatus of claim 13, wherein the process resistant material comprises at least one metal.

15. The apparatus of claim 14, wherein the at east one metal is selected from the group consisting of steel, stainless steel, hardened steel, nickel-plated steel, aluminum, nickel and chromium.

16. The apparatus of claim 12, wherein a cooling system is disposed in communication with the contamination collector.

17. The apparatus of claim 16, wherein the cooling system includes water, glycols, alcohols or air.

18. Apparatus for heating substrates, comprising:
  a chamber having a cavity;
  at least one cassette having a plurality of heated supports disposed within the cavity to support a plurality of substrates;
  a heating layer disposed within the cavity and positioned to provide radiant heat to the at least one cassette; and
  a contamination collector for accumulating contaminates from within the chamber, wherein the contamination collector is a second chamber.

19. The apparatus of claim 18, wherein a cooling system is disposed in communication with the contamination collector.

20. The apparatus of claim 19, wherein the cooling system includes water, glycols, alcohols or air.

21. Apparatus for heating substrates, comprising:
  a chamber having a cavity;
  at least one cassette having a plurality of heated supports disposed within the cavity to support a plurality of substrates;
  a heating layer disposed within the cavity and positioned to provide radiant heat to the at least one cassette; and
  a contamination collector for accumulating contaminates from within the chamber, wherein the contamination collector is a support member for the plurality of heated supports.

22. The apparatus of claim 21, wherein the support member is coupled to an actuator for moving the plurality of heated supports.

23. A apparatus for heating substrates, comprising:
  a chamber having a cavity;
  at least one cassette having a plurality of heated supports disposed within the cavity to support a plurality of substrates;
  a heating layer disposed within the cavity and positioned to provide radiant heat to the at least one cassette; and
  a contamination collector for accumulating contaminates from within the chamber, wherein a chamber temperature is greater than a temperature of the contamination collector.

24. The apparatus of claim 18, wherein the contamination collector is protruding from the chamber.

* * * * *